United States Patent
Kari

(10) Patent No.: US 11,215,523 B2
(45) Date of Patent: *Jan. 4, 2022

(54) DEVICES AND METHODS TO ENHANCE ACCURACY OF TORQUE SENSORS

(71) Applicant: MagCanica, Inc., San Diego, CA (US)

(72) Inventor: Ryan J. Kari, Encinitas, CA (US)

(73) Assignee: MagCanica, Inc., San Diego, CA (US)

( * ) Notice: Subject to any disclaimer, the term of this patent is extended or adjusted under 35 U.S.C. 154(b) by 382 days.

This patent is subject to a terminal disclaimer.

(21) Appl. No.: 15/841,266

(22) Filed: Dec. 13, 2017

(65) Prior Publication Data

US 2018/0172540 A1    Jun. 21, 2018

Related U.S. Application Data

(63) Continuation-in-part of application No. PCT/US2016/037548, filed on Jun. 15, 2016, which
(Continued)

(51) Int. Cl.
*G01L 25/00* (2006.01)
*G01L 3/14* (2006.01)
(Continued)

(52) U.S. Cl.
CPC .......... *G01L 25/003* (2013.01); *G01L 3/102* (2013.01); *G01L 3/14* (2013.01); *G01L 25/00* (2013.01);
(Continued)

(58) Field of Classification Search
CPC ......... G01L 25/00; G01L 25/003; G01L 3/14; G01L 3/10; G01L 3/104; G01L 3/1435;
(Continued)

(56) References Cited

U.S. PATENT DOCUMENTS 2,751,576 A * 6/1956 Soergel ................. G01L 9/0026
340/870.43
5,351,555 A    10/1994 Garshelis
(Continued)

FOREIGN PATENT DOCUMENTS

DE    10002007 A1    7/2001
EP    0187218 A1    3/2001
(Continued)

OTHER PUBLICATIONS

Al Janaideh et al., An Analytical Generalized Prandtl-Ishlinskii Model Inversion for Hysteresis Compensation in Micropositioning Control, IEEE/ASME Transaction on Mechatronics, 2011, 734-744, 16(4).
(Continued)

*Primary Examiner* — Alexander Satanovsky
*Assistant Examiner* — Lynda Dinh
(74) *Attorney, Agent, or Firm* — Acuity Law Group, P.C.; Daniel M. Chambers

(57) ABSTRACT

This invention concerns torque sensor systems and methods that computationally compensate in real-time for hysteresis in signals output from sense elements that are indicative of a torque, including a time-varying torque. In preferred embodiments, temperature effects can also be compensated for by such methods and systems.

15 Claims, 17 Drawing Sheets

Related U.S. Application Data is a continuation of application No. 14/741,305, filed on Jun. 16, 2015, now Pat. No. 9,435,708.

(51) Int. Cl.
| | |
|---|---|
| *H01L 41/00* | (2013.01) |
| *G06F 17/00* | (2019.01) |
| *G01L 3/10* | (2006.01) |
| *H01L 41/12* | (2006.01) |

(52) U.S. Cl.
CPC ............ *G01L 3/104* (2013.01); *G01L 3/1435* (2013.01); *G06F 17/00* (2013.01); *H01L 41/12* (2013.01); *H01L 41/125* (2013.01)

(58) Field of Classification Search
CPC ..... G01L 31/103; G01L 31/102; G06F 17/00; H01L 41/12; H01L 41/125
See application file for complete search history.

(56) References Cited

U.S. PATENT DOCUMENTS

| | | | | |
|---|---|---|---|---|
| 5,520,059 | A | | 5/1996 | Garshelis |
| 5,780,777 | A | * | 7/1998 | Selig .................. G01G 23/3707 177/211 |
| 6,047,605 | A | | 4/2000 | Garshelis |
| 6,145,387 | A | | 11/2000 | Garshelis |
| 6,260,423 | B1 | | 7/2001 | Garshelis |
| 6,513,395 | B1 | | 2/2003 | Jones |
| 6,553,847 | B2 | * | 4/2003 | Garshelis ................ G01L 3/102 73/862.336 |
| 7,308,835 | B2 | | 12/2007 | Cripe |
| 7,350,425 | B2 | | 4/2008 | Cripe |
| 7,401,531 | B2 | | 7/2008 | Cripe |
| 8,424,393 | B1 | | 4/2013 | Lee |
| 8,438,937 | B2 | * | 5/2013 | Garshelis ................ G01L 3/102 702/43 |
| 9,046,430 | B2 | | 6/2015 | Moran et al. |
| 2008/0186000 | A1 | * | 8/2008 | Kimura ................. B60L 15/025 322/23 |
| 2008/0245159 | A1 | | 10/2008 | Garshelis et al. |
| 2012/0042192 | A1 | * | 2/2012 | Rae .......................... H03B 5/04 713/500 |
| 2012/0322618 | A1 | * | 12/2012 | Reibold ................... F16D 48/06 477/180 |
| 2013/0014589 | A1 | * | 1/2013 | Sheiretov ................ G01L 3/105 73/765 |
| 2016/0329803 | A1 | * | 11/2016 | Burigo ................... H02K 41/06 |

FOREIGN PATENT DOCUMENTS

| | | |
|---|---|---|
| EP | 1752752 A1 | 2/2007 |
| WO | 2017/060346 A1 | 4/2017 |

OTHER PUBLICATIONS

Al Janaideh, Modeling and Compensation of Rate-Dependent Asymmetric Hysteresis Nonlinearities of Magnetostrictive Actuators, 2013, Concordia U. Thesis, 1-187.
Ang et al., Modeling Rate-dependent Hysteresis in Piezoelectric Actuator, Institute for Software Research Paper, 2003, 1-6, 516.
Belanger et al., Calculation of Hardness Using High and Low Magnetic Fields, ECNDT-Tu4.1.1., 2006, 1-9, Berlin.
Boley et al., Heat treatment effects on sensitivity and hysteresis loops of magnetoelastic torque transducers, J. Appl. Phys., 2000, 7073-7075, 87(9).
Boley et al., The effects of chromium concentration on magnetically polarized heat-treated steel torque transducer shafts, IEEE Trans. Mag., 2004, 2661-2663, 40(4 Part 2).
Brokate, Some mathematical properties of the Preisach model for hysteresis, IEEE Transactions on Magnetics, 1989, 2922-2924, 25(4).
Brokate et al., Hysteresis and Phase Transitions, 1996, vol. 121, Springer-Verlag, New York (Table of Contents Only).
Chandler (Ed.), 9310H, 9310RH, Heat Treater's Guide: Practices and Procedures for Irons and Steels, 1994, 498-502, ASM International, Materials Park, OH, USA.
Davino et al., Compensation and control of two-inputs systems with hysteresis, J. Phys. Conf., 2011, 268, 012005 (16 pages).
Dupre et al., Hysteresis Models for Transient Simulation, in Scientific Computing in Electrical Engineering, 2001, 105-112, 18, Berlin: Springer-Verlag.
Eielsen et al., Adaptive feed-forward hysteresis compensation for piezoelectric actuators, Rev. Sci. Instrum., 2012, 085001, 83 (8 pages).
Fraden, Sensor Characteristics, in Handbook of Modern Sensors: Physics, Designs, and Applications, 3rd Edition., 2004, 13-36, Ch. 2, Springer.
Garshelis et al., "Negative" Hysteresis in Magnetoelastic Torque Transducers, IEEE Trans. Mag., 2009, 4471-4474, 45(10).
Garshelis et al., A magnetoelastic force transducer based on bending a circumferentially magnetized tube, J. Appl. Phys., 2010, 09E719, 107(9) (3 pages).
Gere et al., Mechanics of Materials (ED No. 4), 1997, 19-20, Ch. 1, Part 1.4, PWS Publishing Company, Boston, MA, USA.
Hiedegard et al., Non-parametric convex identification of extended generalized Prandtl-Ishlinskii models, Automatica, 2013, 465-474, 50(2).
Hergli et al., Identification of Preisach hysteresis model parameters using genetic algorithms, J. King Saud University—Science, 2017, 1-7, doi: https://doi.org/10.1016/tjksus.2017.11.005.
Horii et al., Compensation for Tactile Hysteresis Using Gaussian Process with Sensory Markov Property, 2014, 14th IEEE-RAS International Conference on Humanoid Robots (Humanoids), 993-998.
Ikhouane et al., Systems with Hysteresis: Analysis, Identification and Control Using the Bouc-Wen Model, 2007, John Wiley & Sons, Ltd., Chichester, England (Table of Contents Only).
Jiles et al., Theory of ferromagnetic hysteresis, J. Magnetism and Magnetic Materials, 1986, 48-60, 61(1-2).
Kari et al., Magnetoelastic Torquemeter System for LCAC Hovercraft Turboshaft Engine Monitoring and Control, ASME Turbo Expo, 2012, GT2012-69126, 339-348, 5.
Kilmartin, Magnetoelastic Torque Sensor Utilizing a Thermal Sprayed Sense Element for Automotive Transmission Applications, SAE, 2003, 2003-01-0711 (8 pages).
Mayergoyz et al., Generalized Preisach model of hysteresis, IEEE Transactions on Magnetics, 1988, 212-217, 24(1).
Nealis et al., Model-Based Robust Control Design for Magnetostrictive Transducers Operating in Hysteretic and Nonlinear Regimes, IEEE Transactions on Control Systems Technology, 2007, 22-39, 15(1).
Seco et al., Hysteresis Compensation in a Magnetostrictive Linear Position Sensor, Sensors and Actuators A, 2004, 247-253, 110(1-3).
Smith, Inverse Compensation for Hysteresis in Magnetostrictive Tranducers, Mathematical and Computer Modelling, 2001, 285-298, 33(1-3).
Stroehla et al., Hysteresis Compensation of Electromagnets, Mech. Eng., 2006, 35-44, 4(1).
Sutor et al., A modified Preisach hysteresis operator for the modeling of temperature dependent magnetic material behavior, J. of Applied Physics, 2011, 07D338-1-07D3383, 109(7).
Visintin, Differential Models of Hysteresis, 1994, vol. 111, 130-150 Ch. 5, Berlin: Springer-Verlag.
Visone, The Duhem Model, Hysteresis modelling and compensation for smart sensors and actuators, J. Phys. Conf., 2008, 138, 012028 (24 pages).
Wakiwaka et al., New magnetostrictive type torque sensor for steering shaft, Sensors and Actuators A—Physical, 2001, 103-106, 91(1-2).
Wun-Fogle et al., Magnetostriction and Magnetization of Common High Strength Steels, IEEE Trans. Mag., 2009, 4112-4115, 45(10).

* cited by examiner

Applied stress versus time

Torque sensor output versus applied stress (MPa)

Hysteresis versus applied stress

All units in millimeters

DEVICES AND METHODS TO ENHANCE ACCURACY OF TORQUE SENSORS

RELATED APPLICATIONS

This application is a continuation-in part of and claims the benefit of and priority to PCT application serial number PCT/US2016/037548, filed 15 Jun. 2016 and published as WO/2016/205313 on 22 Dec. 2016, which claims priority to U.S. patent application Ser. No. 14/741,305, filed 16 Jun. 2015, now U.S. Pat. No. 9,435,708, issued on 6 Sep. 2016.

FIELD OF THE INVENTION

The present invention relates to devices and methods for correcting errors in torque sensor systems. Specifically, the present invention relates to devices and methods of applying computational compensation to electronic signals to overcome errors including, but not limited to, hysteresis inherent in torque sensor systems.

BACKGROUND OF THE INVENTION

The following description includes information that may be useful in understanding the present invention. It is not an admission that any such information is prior art, or relevant, to the presently claimed inventions, or that any publication specifically or implicitly referenced is prior art.

BACKGROUND

Basic to the operation of modern machinery is the transmission of mechanical energy from source locations to points of utilization through rotating shafts transmitting torque. Thus, in the control and monitoring of systems having rotating shafts, torque is a fundamental parameter of interest. Therefore, the sensing and measurement of torque in an accurate, reliable, and inexpensive manner has been pursued for several decades.

Torque measurement has been accomplished using contact and non-contact type sensors. One type of sensor that is in contact with a rotating shaft is a "strain gauge"-type torque detection apparatus, in which one or more strain gauges are directly attached to the shaft or hub carrying torque. Strain on the shaft is translated to the strain gauge, which causes a change in resistance in the strain gauge that is typically measured with a bridge circuit. As the sensor has to be directly in contact with the shaft under torque, both wired and wireless telemetry systems have been developed to supply power to the strain gauges on the shaft as well as extract signals from them. Contact-type sensors tend to be commercially impractical for use in many applications for a number of reasons: (i) they tend to be relatively expensive; (ii) systems that provide wireless telemetry capabilities typically require a significant amount of volume in near proximity to the shaft which makes locating them in tight enclosures, such as gearboxes, difficult; (iii) they may emit or be susceptible to electromagnetic emissions; and (iv) as the strain gauges and the associated electrical components are located on or within the shaft transmitting the torque, there are also limitations as to the maximum rotational speed of the shaft permitted due to the centripetal forces created, as well as limitations as to the maximum allowable temperature of the shaft. One type of non-contact torque sensor uses the magnetostrictive properties of a ring attached to a shaft carrying torque. See, e.g., U.S. Pat. Nos. 5,351,555 and 5,520,059. Tensile "hoop" stress in the ring, associated with how the ring is attached to the shaft, establishes a dominant, circumferentially directed, uniaxial anisotropy. Upon the application of torsional stress to the shaft, the magnetization reorients and becomes increasingly helical as torsional stress increases. The helical magnetization resulting from torsion has a circumferential component as well as axial and radial components, with the magnitude of the axial component depending entirely on the torsion. The radial component will be dependent on torsion, but may also be influenced by other stresses applied to the shaft such as bending (Garshelis & Tollens, 2010). One or more magnetic field vector sensors can be used to measure the magnitude and polarity of the magnetic field arising as a result of the applied torque in the space about the transducer in order to provide a signal output reflecting the magnitude and polarity of the torque. While the fields that arise from the ring itself have only hard axis components relative to the anisotropy, "parasitic" fields from permeable material that is close enough to become magnetized by the ring field have no such limitation. The addition of such parasitic fields to the torque-dependent field from the ring can seriously degrade the near-ideal features of the transfer function (defined as the ratio of the output to input) of the measured magnetic field versus applied torsional stress to the shaft. In order to avoid a major source of such distortion, it is preferred that the shaft the ring is placed on be fabricated from a paramagnetic material.

The elimination of issues associated with such ring constructions spurred development of magnetoelastic torque transducers in which one or more active, torque-sensing regions is(are) formed directly on the shaft itself. Such transducers and related systems are described in, for example, U.S. Pat. Nos. 6,260,423 and 6,047,605. In one form of such so-called "collarless" transducers, the magnetoelastically active region is polarized in a circumferential direction and itself possesses sufficient magnetic anisotropy to return the magnetization in the region, following the application of torque to the member, to the fully circumferential direction when the applied torque is reduced to zero. Additional permutations of providing a polarized region have also been described, such as in U.S. Pat. No. 8,438,937, which describes devices used for detecting rates of change of torque in which the polarized region has a magnetic field applied either continuously or prior to a measurement being obtained. Additional permutations of non-contact magnetoelastic torque sensors have also been developed that provide signals indicative of the torque transmitted between radially separated locations of disk-shaped members, where one of more magnetized regions radially located along the disk is used (see, e.g., U.S. Pat. Nos. 8,424,393 and 9,046, 430).

As described by U.S. Pat. No. 6,260,423, in constructions in which one or more active, torque-sensing regions(s) is(are) formed directly on the shaft itself, the following basic conditions are required for the shaft and magnetic field sensors to function together as a torque measuring system: (i) the active region is ferromagnetic such that it can be remanently magnetized and is magnetostrictive (A); (ii) the active region is defined solely by the existence of remanent magnetization in the circumferential direction; (iii) applied torsional stress causes the circular remanence to develop an axial component, but does not alter the axial component of magnetization within the non-magnetized regions of the shaft. Hence, there is a divergence of this component of magnetization and an external field thereby arises; (iv) magnetic fields or magnetic field gradients of sufficient amplitude developed in the sensing region from the application of torsional stress are large enough to be measureable with a finite resolution of the magnetic field sensing device and associated acquisition system, and are substantially larger than the usually encountered ambient field or magnetic field gradients arising from parasitic sources; and (v) the transfer function of the measureable magnetic field in the sensing region versus applied torque or torsional stress to the shaft acting as the transducer is stable: (a) during repeated cyclic application of torsional stress; (b) with time; and (c) under any of the operational and environmental conditions that the shaft might be subjected to.

In such configurations, the torqued shaft or disk is desirably formed of a polycrystalline material wherein at least 50% of the distribution of local magnetizations lies within a 90-degree quadrant symmetrically disposed around the direction of magnetic polarization and has a coercivity sufficiently high that the field from the transducing region does not create parasitic magnetic fields in regions proximate to the shaft of sufficient strength to destroy the usefulness, for torque sensing purposes, of the net magnetic field detected by the magnetic field sensor(s). For small stresses applied to the shaft, magnetization will change in part through domain wall motion; domain walls will move in such a way as to decrease the volume of domains magnetized at right angles to the torsional stress axis, resulting in domain wall pinning and consequential hysteresis of magnetization acting in the direction in which torsional stress was last applied. Larger torsional stresses applied to the shaft eliminate domain wall motion, but result in fields that, if not sufficient to destroy the net magnetization, are sufficiently high to magnetize proximate regions of the shaft leading to remanent magnetization acting on the sensing region in the opposite direction to that created by the torsional stress last applied.

As stated in U.S. Pat. No. 6,260,423, which again describes a "collarless" transducer, "hysteresis in the transfer function is the primary source of imperfect performance." The particular characteristics of such magnetic hysteresis are dependent upon but not limited to: the shaft material characteristics; heat treatments applied to the shaft; geometry; operating temperature of the shaft; and torsional stress and history of the torsional stress applied. The accuracy and, ultimately, the usefulness of the torque measurement system is thus limited by magnetic hysteresis as well as by the influence of temperature on the torque transducer. In practice, the selection of shaft material and the processes used to fabricate the shaft and its subsequent thermal and mechanical treatments are usually made to best fulfill the primary shaft function, i.e., the mechanical transmission of torque, with little concern for whether these factors satisfy the preferences for magnetoelastic torque sensing. Even in cases in which the material has characteristics that are ideal for both the transmission of torque and torque sensing, there may be variations or inconsistencies that cannot be controlled in practice that influence the magnitude of magnetic hysteresis in the torque sensor transfer function. Examples of these variations are the shaft's chemical composition, heat treatment, and stresses induced during fabrication, all of which can influence the characteristics of magnetic hysteresis when the shaft is used as a magnetoelastic torque transducer. As an example of the variation allowed for in standard steels, consider a common type of steel such as AMS 6265 (also known as AISI 9310). As per the material specifications, the chemical composition of alloying elements can range as follows: nickel, 3% to 3.5%; chromium, 1% to 1.4%; manganese, 0.45% to 0.65%; and silicon, 0.15% to 0.30%. As per the standard heat treatment specifications for AISI 9310, the finished hardness, which is often correlated with magnetic properties of the material (see, e.g., Belanger and Narayanan (2006)), is allowed to vary from 36 to 43 near the surface (Chandler (1994)).

Many efforts have been made to eliminate or reduce the effect of hysteresis in magnetoelastic torque transducers with different approaches, including: improving materials and heat treatments that might offer ideal mechanical and magnetoelastic characteristics for the purpose of both transmitting and measuring torque (see, e.g., Wun-Fogle, et al. (2009); Boley, Franklin, and Rigsbee (2000); Boley, Franklin, and Orris (2004)); processes for bonding and plating magnetoelastic materials to shafts (see, e.g., U.S. Pat. No. 7,401,531; Kilmartin (2003)); post-magnetization procedures to reduce hysteresis (see, e.g., U.S. Pat. Nos. 7,308,835 and 7,350,425); and selecting the most effective excitation or other operation-related conditions (see, e.g., Wakiwaka and Mitamura (2001)).

Other types of torque transducers, including contact type sensors, also exhibit hysteresis. One source of hysteresis present in torque transducers based on a measurement of strain (which includes both strain-gauges and phase-shift torque-meters) originates from a non-linear relationship between the applied torque and angular displacement of the shaft, such as that caused by mechanical yielding (plastic deformation) of the shaft, which occurs when the applied torsional stress exceeds the proportional limit for the shaft material. Should the shaft plastically deform, upon relaxing the torsional stress to zero, the strain will not fully be recovered (Gere and Timoshenko, 1997 pp. 19 to 20). Should the strain-based torque sensor have any aspect of plastic deformation or any non-linearity in the measurement of strain that is based on the history of prior torque applications, the torque sensor will exhibit hysteresis. An additional source of hysteresis in strain gauges that are bonded to a shaft stems from slippage or movement in the polymer coating or bonding agent used to fix the strain-sensing element to the object being measured (Enser, et al. (2017)). While the hysteresis error on these types of sensors is often very small (e.g., <0.1% rated output) as compared to systems based on circumferential remanent magnetization, in high accuracy torque measurement systems its contribution to net error cannot be neglected.

To date, given a transducer with less than ideal hysteresis, no universal approach exists to consistently reduce hysteresis to an acceptable level. This invention addresses, among other things, this long-appreciated but still unresolved need.

Definitions

Before describing the instant invention in detail, several terms used in the context of the present invention will be defined. In addition to these terms, others are defined elsewhere in the specification, as necessary. Unless otherwise expressly defined herein, terms of art used in this specification will have their art-recognized meanings.

The terms "measure", "measuring", "measurement" and the like refer not only to quantitative measurement of a particular variable, but also to qualitative and semi-quantitative measurements. Accordingly, "measurement" also includes detection, meaning that merely detecting a change, without quantification, constitutes measurement.

A "patentable" process, machine, or article of manufacture according to the invention means that the subject matter satisfies all statutory requirements for patentability at the time the analysis is performed. For example, with regard to novelty, non-obviousness, or the like, if later investigation reveals that one or more claims encompass one or more embodiments that would negate novelty, non-obviousness, etc., the claim(s), being limited by definition to "patentable"

embodiments, specifically exclude the unpatentable embodiment(s). Also, the claims appended hereto are to be interpreted both to provide the broadest reasonable scope, as well as to preserve their validity. Furthermore, if one or more of the statutory requirements for patentability are amended or if the standards change for assessing whether a particular statutory requirement for patentability is satisfied from the time this application is filed or issues as a patent to a time the validity of one or more of the appended claims is questioned, the claims are to be interpreted in a way that (1) preserves their validity and (2) provides the broadest reasonable interpretation under the circumstances. In this regard, terms of approximation or degree (or relative terms) such as "about", "substantially" and the like will be as understood by those of ordinary skill in the art, and will typically mean a range of values around the stated value. If necessary in the particular context, such a term will be understood to mean a range of values varying from by as much as 1, 2, 3, 4, 5, 6, 7, 8, 9, or 10% more or 1, 2, 3, 4, 5, 6, 7, 8, 9, or 10% less (or some smaller variance) than the stated value.

SUMMARY OF THE INVENTION

The object of the invention is to provide methods and systems for hysteresis compensation.

Thus, in one aspect, the invention concerns methods of hysteresis compensation in a signal (e.g., an electronic signal) indicative of a sensed-torque parameter experienced by a member, preferably a torque-transmitting shaft, upon application of a torque or a time-varying torque.

The methods of the invention include using a sense element disposed on or in sensing relation to a torque-transmitting member. Such configurations allow for the generation of a signal indicative of a sensed torque parameter from the torque-transmitting member upon application of a time-varying torque. The signal that is indicative of the sensed-torque parameter exhibits hysteresis error between about 0.01% and about 20%. The signal is then computationally processed to compensate for the hysteresis in the signal that is associated with the application of the time-varying torque. In preferred embodiments, such processing utilizes stored information for the member that is correlated with a torque history or a degree of prior hysteresis compensation for at least one signal indicative of the sensed torque parameter upon prior application of a time-varying torque to the member in order to compensate for magnetic hysteresis in the signal.

In some embodiments, the methods of the invention also involve compensating for temperature-related magnetic hysteresis variation and temperature-related changes in the transfer function of the magnetized region of the member.

Some preferred embodiments concern methods wherein the member features a remanently magnetized region or band, wherein the magnetization preferably has a circumferential orientation. The magnetized band may be located on an inner or outer surface of a cylindrical shaft, or on the surface of a disk (e.g., a flange, a gear, etc.) in which torque is transmitted between radially separated locations. The region may be optionally transiently magnetized, in which the magnetization is preferably refreshed (continuously, periodically at regular intervals, or intermittently). The sense element(s) is(are) disposed in sensing relation to a magnetized band.

Some embodiments concern methods wherein the member uses a sense element that is disposed in sensing relation through direct contact on the member (e.g., a strain gauge bonded or otherwise operably affixed in torque sensing relation to the member) or where the sense element is fixed to the member and excited using a non-contact method (e.g., a surface acoustic wave-based method). Some embodiments concern methods wherein the sensed parameter is indicative of the angular displacement of the member under the application of torque (e.g., a phase-shift torque-meter).

In some preferred embodiments, the sense element of the devices and systems of the invention is disposed proximate to the member's magnetized region in order to output a signal indicative of the torque parameter when the member experiences or is subjected to a time-varying torque. In some embodiments, when the sense element senses a magnetic parameter of the magnetized region, the magnetic parameter is optionally magnetic flux or magnetization orientation.

In some preferred embodiments, the sense element is in contact with the shaft in, for example, the form of a strain gauge in which there is a resistive (or capacitive or other) change experienced by the strain gauge indicative of a torque parameter when the member experiences or is subjected to a time-varying torque.

Some embodiments concern methods wherein the member transmitting torque is a shaft or disk that is not fully continuous or solid over a 360° arc (a sector of a disk, a disk having a segment removed, a torque-transmitting arm or lever, etc.). In such embodiments, the sense element(s) is(are) disposed in sensing relation on a portion of the member that is continuous and may optionally be fixed or be located directly on the member.

In addition, the devices and systems of the invention preferably include a power supply and signal conditioning for the signal that are configured to output a signal indicative of one or more torque parameters and signal conditioning to condition the signal to be accepted by a processor operatively associated with the sense element, and configured to: (i) process signals output from the sense element to determine the torque parameter(s); and (ii) compensate for hysteresis in the signal. In preferred embodiments, the instant devices and systems also include a memory operatively associated with the processor that is configured to store data representing a torque history or degree of prior hysteresis compensation for the magnetized region upon application of a time-varying torque to the member.

Other features and advantages of the invention will be apparent from the following drawings, detailed description, and appended claims.

BRIEF DESCRIPTION OF THE DRAWINGS

FIG. 4A shows three cyclic loads applied as a function of time indicated by 1, 2, and 3. FIG. 4B shows the transfer functions of measured magnetic field converted into volts versus applied torsional stress from the three loading conditions of FIG. 4A. FIG. 4C is a plot of the percentage of hysteresis for each of the three transfer functions of FIG. 4B as a function of applied torque.

FIG. 6A is a graphical illustration of a typical "major" hysteresis loop of a ferromagnetic material. FIG. 6B is a graphical illustration of a typical "minor" hysteresis loop of a ferromagnetic material.

FIG. 7A shows the loading cycles applied to a shaft as a function of time. FIG. 7B shows three transfer functions with cyclic loads applied. Each transfer function has two cycles applied as described by FIG. 7A. FIG. 7C is a plot of the percentage of hysteresis for each transfer function as a function of applied torque.

FIG. 8A shows transfer functions obtained with the shaft and sensor at 35° C., 60° C., 90° C., 120'C, and 150° C. FIG. 8B is a plot of the percentage of hysteresis for each transfer function as a function of applied stress.

FIG. 10A is a plot of the percentage of hysteresis for each transfer function first presented in FIG. 7A. FIG. 10B is a plot of the percentage of hysteresis for each transfer function after compensation is applied.

FIG. 11A is a plot of percentage of hysteresis of the measured magnetic fields versus applied stress for applied torsional stress cycles obtained at two temperatures, 35° C. and 150° C., originally presented in FIG. 8. FIG. 11B is a plot of the percentage of hysteresis for each transfer function after compensation is applied.

FIG. 12A is a front view. FIG. 12B is a side view. FIG. 12C is an isometric view.

FIG. 15A represents a shaft member transmitting torque, in which the shaft member features band(s) of remanent circumferential magnetization and proximate sense elements to provide a signal indicative of torque. FIG. 15B represents the shaft member from FIG. 15A in which a strain-sensitive element is used to provide a signal indicative of torque.

FIG. 17A and FIG. 17B show the disk indicated in FIG. 16 with features removed from the body of the disk such that it is not fully continuous about its diameter.

Figure 1A:
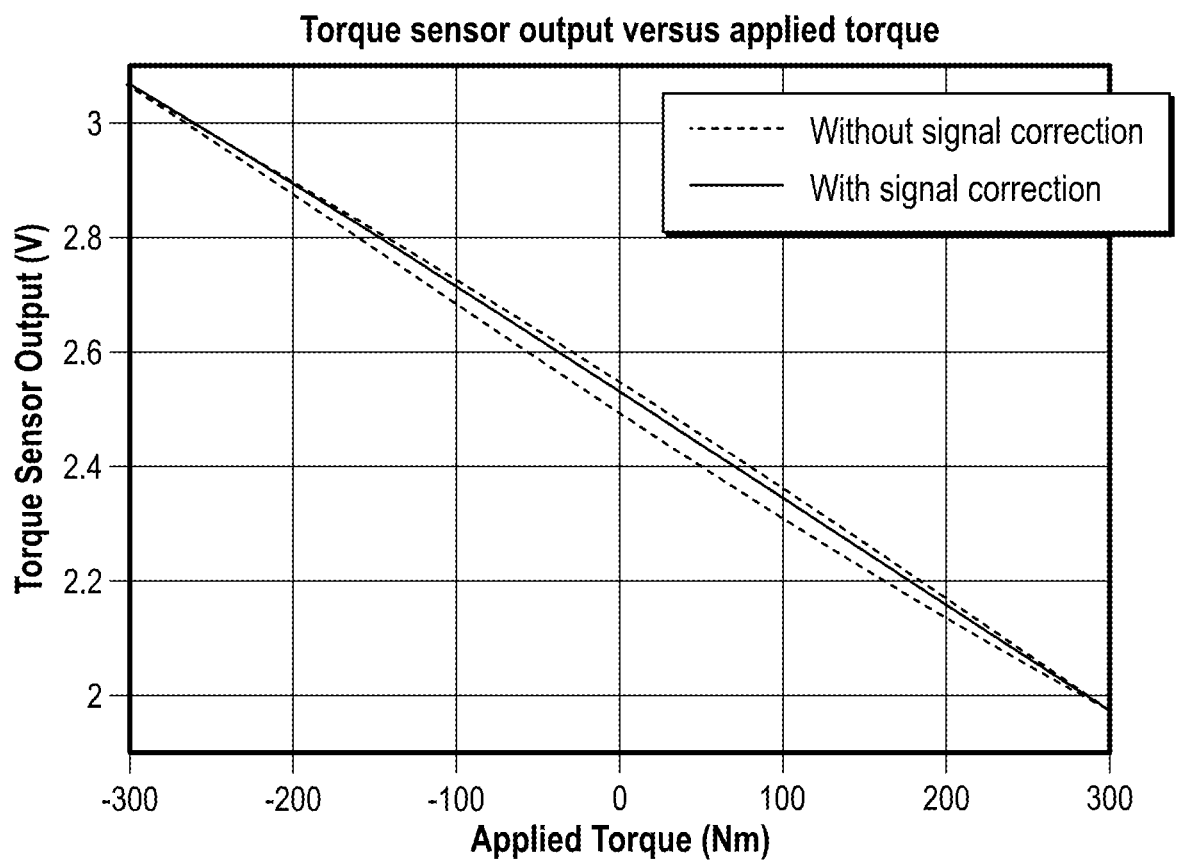
FIGS. 1A and 1B shows two graphs. The graph shown in FIG. 1A is a transfer function of measured magnetic field versus applied torque of 18CrNiMo7-6 alloy steel with and without signal correction. The graph shown in FIG. 1B is a plot of the percentage of hysteresis (i.e., the ratio of the maximum difference in the sensor output at any applied torque to the full-scale, span, or total range of torque applied, while torque is changed) for each transfer function as a function of applied torque.

As those in the art will appreciate, the following detailed description describes certain preferred embodiments of the invention in detail, and is thus only representative and does not depict the actual scope of the invention. Before describing the present invention in detail, it is understood that the invention is not limited to the particular aspects and embodiments described, as these may vary. It is also to be understood that the terminology used herein is for the purpose of describing particular embodiments only, and is not intended to limit the scope of the invention defined by the appended claims.

DETAILED DESCRIPTION

1. Applications of Signal Correction Devices

The present invention describes devices and methods for increasing the accuracy of a torque sensor system. This invention uses signal correcting devices and methods to acquire and digitize one or more electronic signals generated from torque sensing systems that exhibit hysteresis, process such signal(s) to recognize the error from but not limited to hysteresis, and then send a signal that is a function of torque with the error factor(s) reduced or eliminated effectively in real-time. The benefits of implementing such signal correction devices and methods is that errors such as hysteresis that are inherent in torque transducers as described elsewhere herein, including magnetoelastic-based constructions using rings, collarless constructions, constructions using a coating, and sensor constructions based on a measurement of strain, can be reduced or eliminated, as can shaft-to-shaft variations in the characteristics of errors such as hysteresis. The capability of removing errors such as hysteresis from a torque sensor is significant for several reasons, including: 1) the torque transducer can be manufactured from materials or using heat-treatments that would otherwise be unsuitable for magnetoelastic torque sensors; 2) the accuracy of torque transducers can be significantly improved, allowing accuracy requirements to be met for which they would otherwise be unsuitable; and 3) variability across transducers can be reduced, allowing for greater consistency from one transducer as compared with the next.

There are numerous applications in which measuring torque is of interest; however, traditional methods of measuring torque are not practical due to limitations associated with the inability of such systems to fully address challenges posed by other factors such as temperature, speed, or packaging constraints, among others. While a magnetoelastic torque sensor may be able to overcome these issues, it is often the case that the shaft transmitting torque is manufactured from a material that when used as a transducer would have inaccuracies associated with hysteresis and temperature that exceed the accuracy requirements for the application. This is particularly true for the energy and military sectors, in which machinery transmitting torque often operates at high temperature (e.g., >100° C.) and at high rotational speeds (e.g., >14,000 rpm). Considering the energy sector in particular, standard steels used to manufacture wind turbine shafts are 18CrNiMo7-6 and AISI 4340. Testing these materials for use as a magnetoelastic transducer has shown that they display typically 4% or more error due to hysteresis, as well as temperature-dependence in the torque sensor transfer function typically of the same magnitude (>4%). Errors of this magnitude are well beyond what is considered to be acceptable for a torque sensor system.

Figure 1B:
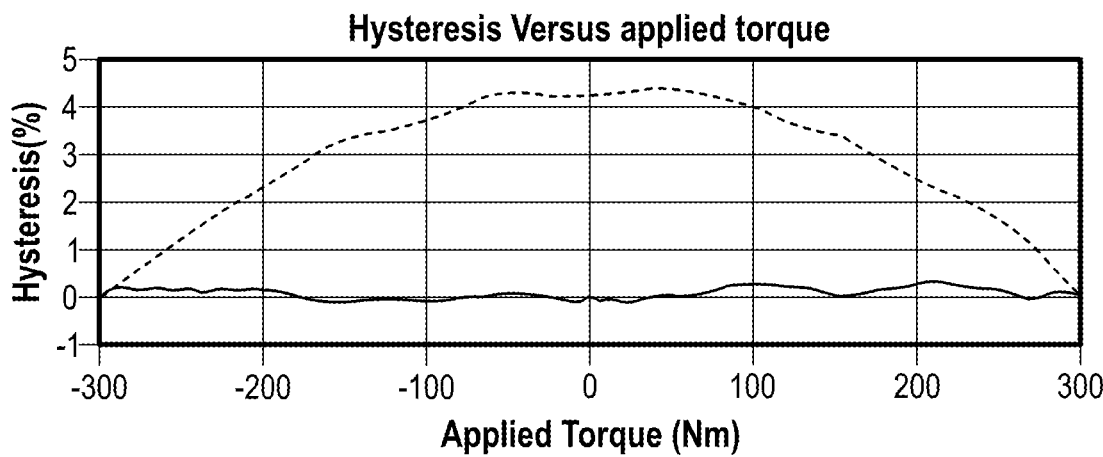

FIG. 1A is a plot of the output of a magnetoelastic torque sensor as a function of applied stress on a shaft manufactured from 18CrNiMo7-6. The uncorrected output is shown in the dashed trace, which has approximately 4.5% error from hysteresis. Hysteresis as a function of applied torque is shown in FIG. 1(b). This invention allows for the removal or significant reduction of this error, as shown by the solid trace, as the error from hysteresis is now less than about 0.5%, which would generally be acceptable for use in this market. As such, this invention makes it possible to use materials for torque sensing that were previously unsuitable for such applications.

The need to use pre-existing or widely available materials is particularly true for the military sector where, due to the high cost of certifying components, there are many potential applications for a torque sensor in which the existing shaft (or shafts made of the same materials as those already certified) is required to be used as the transducer; however, the shaft is manufactured from a material that when used as a transducer will not be accurate enough to meet the requirements for the application. As an example, Kari, et al. (2012) documented the configuration and accuracy of a torque-meter that was retrofitted to the United States Navy LCAC hovercraft, which used the existing engine output shaft manufactured from AMS 6265 as the transducer shaft. While the accuracy of the torque-meter was 2.5% when specified across a wide-range of temperatures, it was only brought to the required 2% by calibrating the sensor at the specific operating temperature of the engine, a practice that is often not an option in other installations. Reducing or eliminating errors associated with hysteresis and temperature would make it possible to utilize magnetoelastic torque sensor technology in many applications for which it is currently unsuited in terms of accuracy, reproducibility, etc.

A similar situation exists for markets such as the laboratory torque sensor market, in which accuracy requirements are typically 0.25% or better, that cannot be easily met with conventional magnetoelastic torque sensor technology. Even with other torque measurement technologies based on the measurement of strain (e.g., strain gauges and phase-shift torque sensors), hysteresis contributes to the net error of the torque transducer and thus limits the ultimate accuracy. However, by implementing real-time signal correction to reduce errors from hysteresis and, in preferred embodiments, temperature, accuracy and other requirements can be met. These examples demonstrate how the application of signal correction in real-time makes it possible to significantly expand the range of applications and markets to which torque sensing technology is suited.

2. Influence and Mechanisms of Hysteresis

Figure 2A:
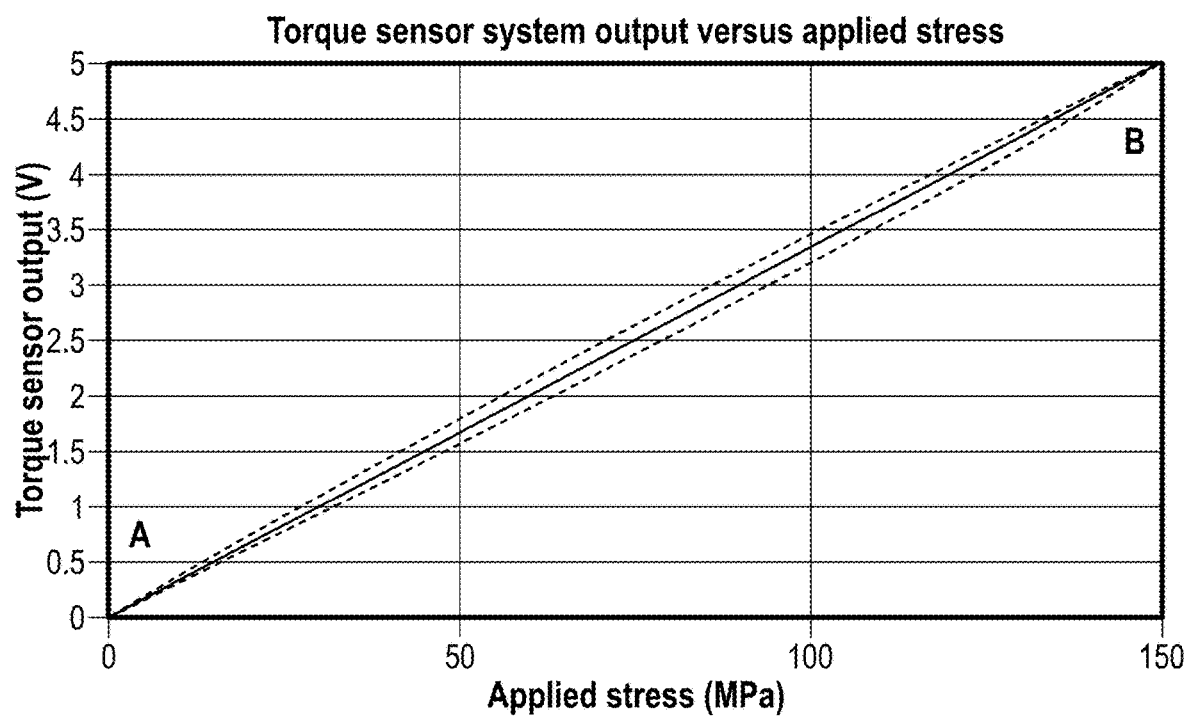
FIGS. 2A and 2B shows two graphs. The graph shown in FIG. 2A is a transfer function of measured magnetic field versus applied torsional stress for a system with hysteresis. A best-fit line is shown connecting the minimum stress and maximum stress. The graph shown in FIG. 2B is a plot of the percentage of hysteresis for the transfer function shown in FIG. 2A.
Figure 2B:
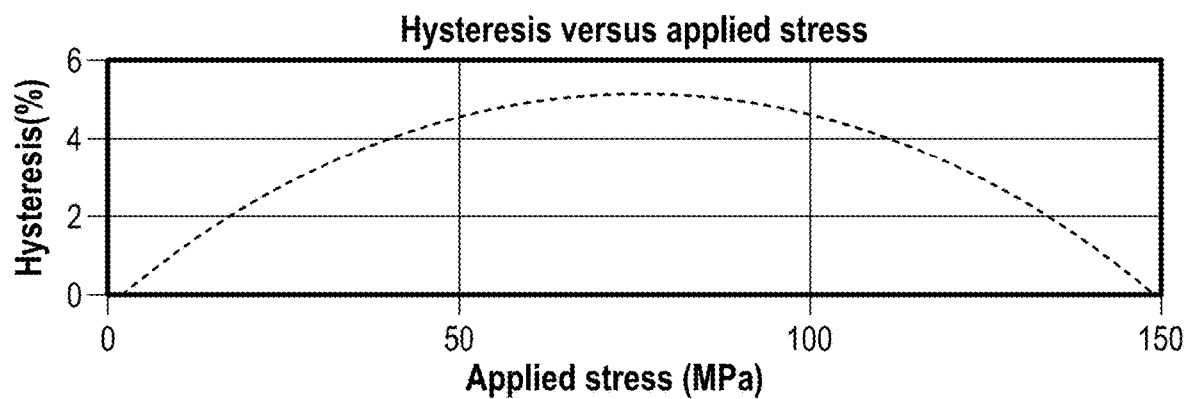

Hysteresis in a torque measurement system may not be an issue in specific scenarios and applications. For systems in which the loading profile is significantly asymmetrical, such that decelerating torques applied to the shaft are negligible relative to accelerating torques and only one nominal load is applied and is of interest, such as a maximum power condition, the presence of hysteresis may be inconsequential. Consider FIG. 2A, and points "A" and "B" in particular. If the load profile applied to the shaft only traverses from "A" to "B" and back to "A", and only the measurement at "B" is of interest, the hysteresis between "A" and "B", represented in FIG. 2(b) as a percentage of the applied torsional stress may be inconsequential, as even significant hysteresis error may not be a factor with regard to the usefulness of the sensor. The presence of hysteresis may also be inconsequential should the primary function be that of recognizing the presence (or lack thereof) of specific frequency components, such as the measurement of torsional vibration or periodic impulses created by reciprocating events that are a function of the operating state of the system, which may include (without limitation), for example, gear mesh harmonics in a transmission, phase actuation in an electric motor, or the firing of pistons in an internal combustion engine.

While these events may potentially be quantified by torque measurement, should the frequency of interest be high (e.g., greater than about 5 kHz) and the amplitude of oscillation of interest be small as compared with the nominal torque or resolution of the measuring system, U.S. Pat. No. 8,438,937 describes methods and devices to measure these signatures by directly measuring the rate of change of torque on a torque-transmitting member acting as a magnetoelastic transducer in which the transducer may demonstrate hysteresis. Should a precise measurement of the peak-to-peak magnitude of oscillating torques via torque or rate-of-change-of-torque be required, hysteresis error may be problematic; in particular, as is shown below, hysteresis error often manifests itself as a change in gain, influencing smaller amplitude excursions especially.

Figure 3:
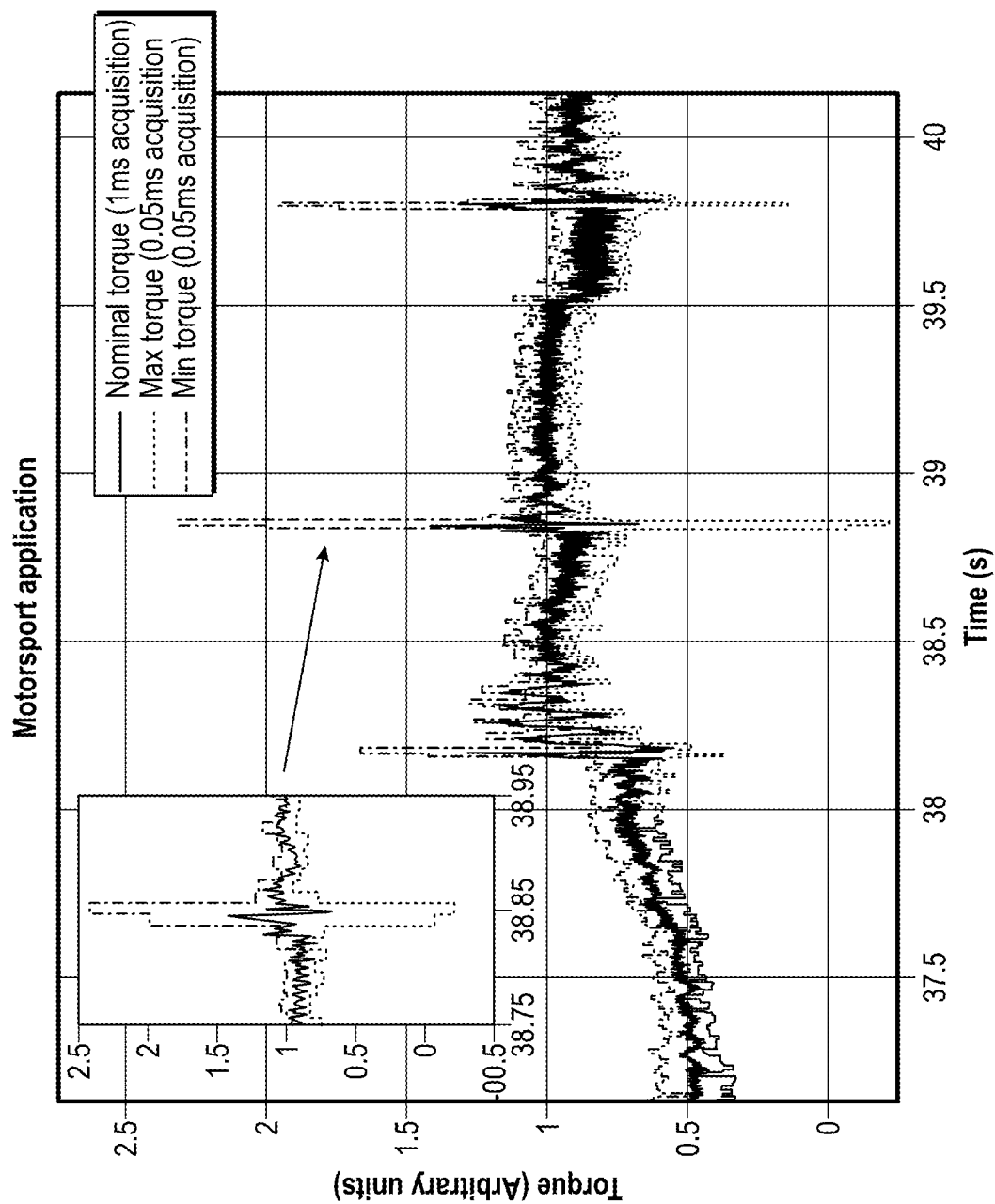
FIG. 3 shows an example of torque peaks captured at a high speed of sampling, as compared with nominal torque applied during a gearshift event in a motorsport application.

Often in practice there are both accelerating and decelerating torques applied to a shaft on which torque is being measured, as well as "overload" torques applied transiently that greatly exceed the nominal or steady-state measurement range of interest. For example, it may be of interest to measure the nominal torque produced by an engine, but impulsive mechanical events such as gearshifts or driveline resonances may produce transient torques of relatively short duration that have peak magnitudes of several times the amplitude of the nominal torque. In these conditions, the inaccuracy induced from magnetic hysteresis may greatly limit the usefulness of the sensor. An example of the peak torque induced during a gearshift in a motorsport application is shown in FIG. 3, in which the peak torque is twice the magnitude of the nominal torque applied to the shaft.

The influence of hysteresis on the output of a torque sensor system may not always be apparent. For a torque sensor system designed for a particular maximum rated capacity, torque cycles applied from the maximum extremum to the minimum extremum and again back to the maximum extremum define the "major" loop. Applied torque cycles that have peak magnitudes that are within the rated capacity are described as "minor" loops. For situations in which the overload range defines the major loop, but the measurement range of interest is defined by a minor loop, errors associated with the minor loop as compared with the actual torque applied during the minor loop can be described as either gain or offset errors (Fraden (2010)).

Figure 4A:
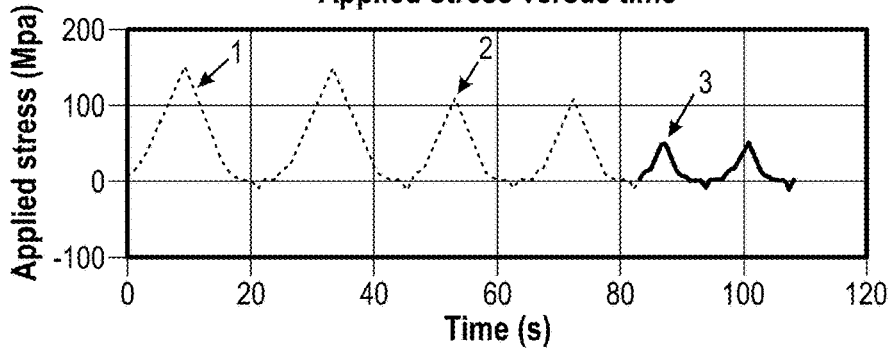
FIGS. 4A-4C shows three graphs.
Figure 4B:
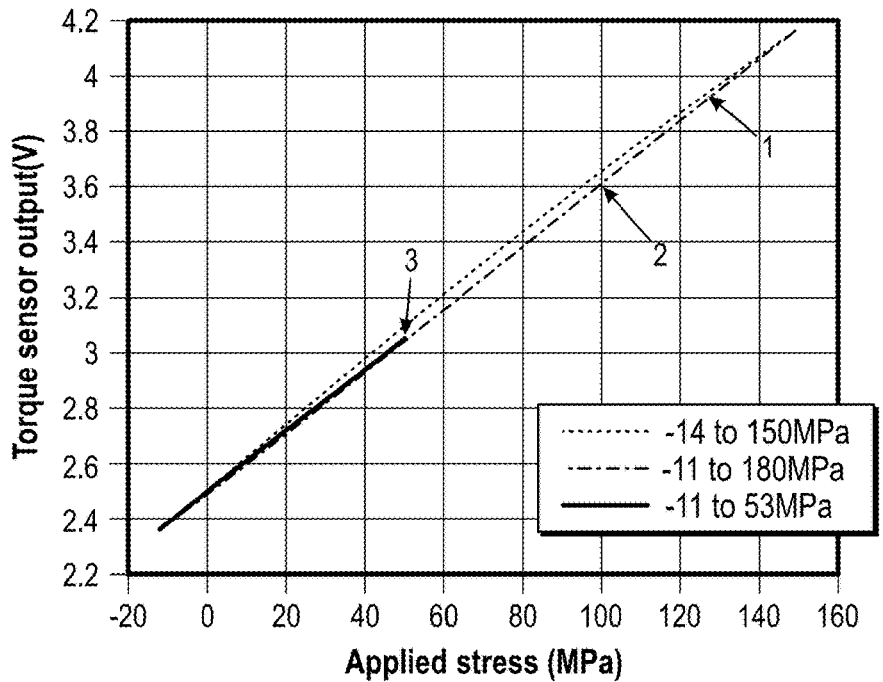
Figure 4C:
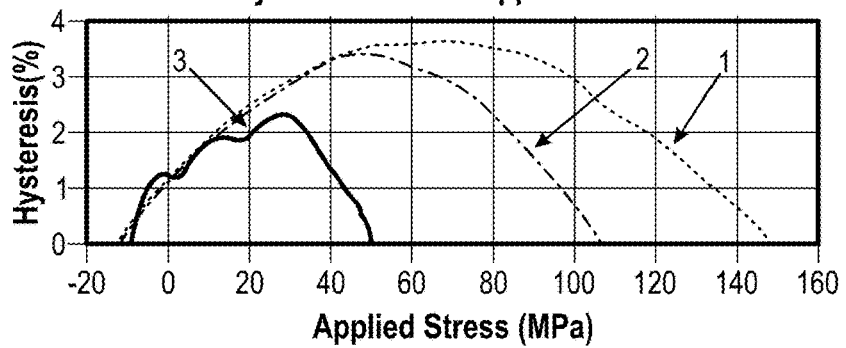

FIG. 4 consists of three plots demonstrating a situation in which hysteresis is observed to cause a gain error in minor loops that is a function of the peak magnitude defining the minor loop. FIG. 4A is a plot of the applied torsional shear stress as a function of time, in which a major loop consisting of two torque cycles is applied from −14 MPa to 150 MPa indicated by "1", followed by two minor loops: from −11 MPa to 108 MPa indicated by "2", and from −11 MPa to 50 MPa indicated by "3". FIG. 4B shows the transfer function of the output signal of the torque sensor system as a function of the applied torsional stress for each stress range. FIG. 4C is a plot of hysteresis as a percentage of the full-scale range defining each respective loop, in which it can be noted that the hysteresis for the major loop has a maximum value of 3.5%. In this example, the offset (output signal at zero torque input) at the unloaded condition (0 MPa) is quite consistent between the three loading conditions, but if a best-fit line is used to compare the transfer function for each loading profile, the effective difference in gain (slope) between the 150 MPa major loop and 105 MPa minor loop is 0.75%, while the difference in gain between the 150 MPa major loop and the 50 MPa minor loop is 3%. The significance of this is that should a calibration be applied to the minor loop (−10 MPa to 50 MPa) that is created from a regression of the full-scale range (−20 MPa to 150 MPa), when operating in the range of the minor loop, a 3% error in gain is to be expected.

Figure 5:
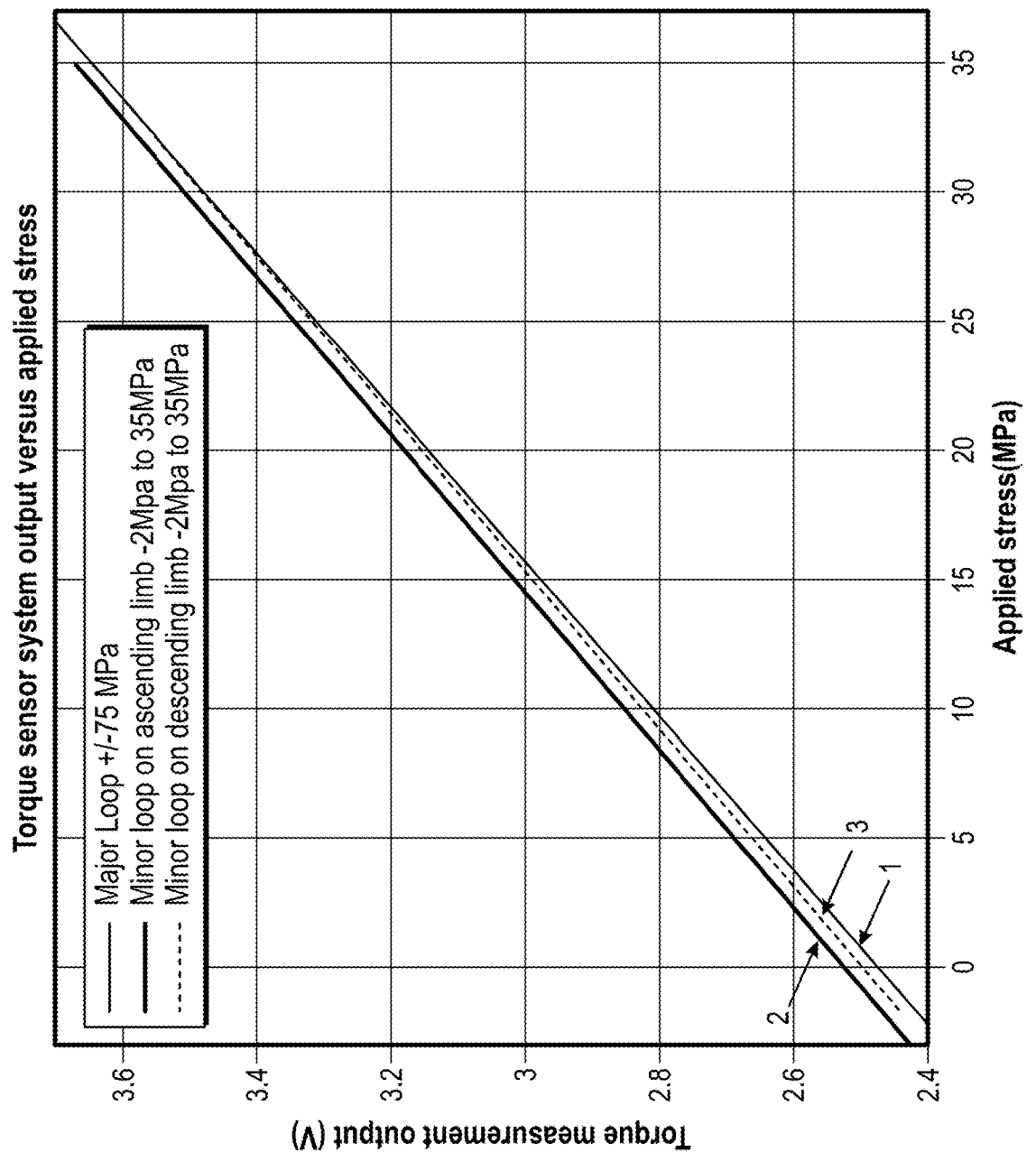
FIG. 5 is a transfer function of measured magnetic field versus applied torsional stress for a system with hysteresis. The ascending and descending limbs of the ±75 MPa transfer function are interrupted with transfer functions defined by applied cyclical loads defined by −2 MPa to 35 MPa peak stresses.

The variation in offset as caused by hysteresis is most obvious when comparing equivalent minor loops following significant applied loads of opposite polarities. FIG. 5 is a plot of a +/−75 MPa major loop with 1% hysteresis indicated by "1", scaled to the range of 2.5 MPa to 37 MPa. The same cyclic minor loop of range −2 MPa to 35 MPa indicated by "2" and "3" was applied while traversing ascending and descending limbs of the major loop. The slope (or gain) of each minor loop is equal and approximately 1.5% less than that of the major loop. The offset error of the minor loops as compared with the major loop is a reasonable 0.7%; however, as compared with the span of the minor loops, the offset error between the minor loops is nearly 3%. The significance of this is that should the torque sensor system be subjected to an overload ratio (defined as the ratio between maximum transient torque and nominal steady-state torque of interest) of only 2:1, even should the major loop defining the overload range have only 1% hysteresis, the minor loop defining the measurement range of interest would have an error that exceeds 3% as a function of its span. In some applications, in particular when torsional resonances are excited during the typical operation of the machine, overloads may be applied that are well beyond the 2:1 ratio, further exacerbating this type of potential error and further highlighting the usefulness of the invention. Examples of such applications include but are not limited to: high-speed, low inertia variable frequency drive electric motors and internal combustion engines.

Figure 6A:
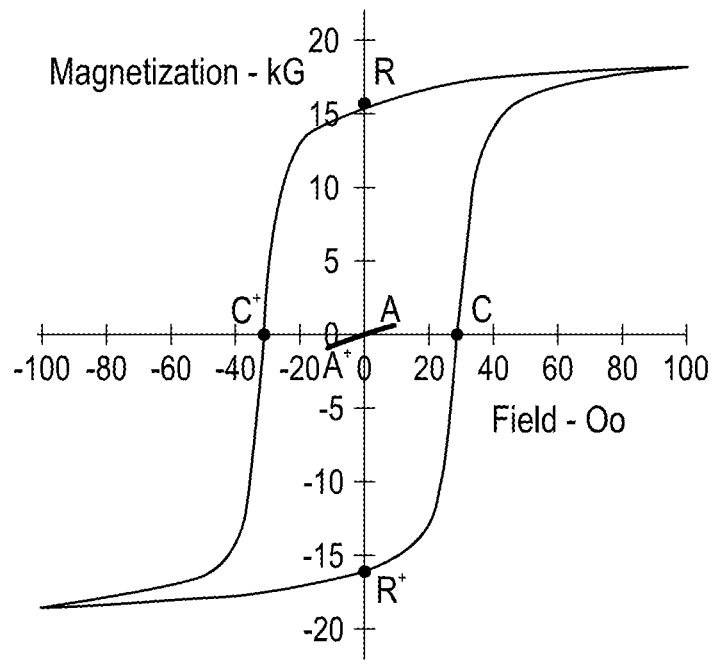
FIGS. 6A and 6B shows two plots.
Figure 6B:
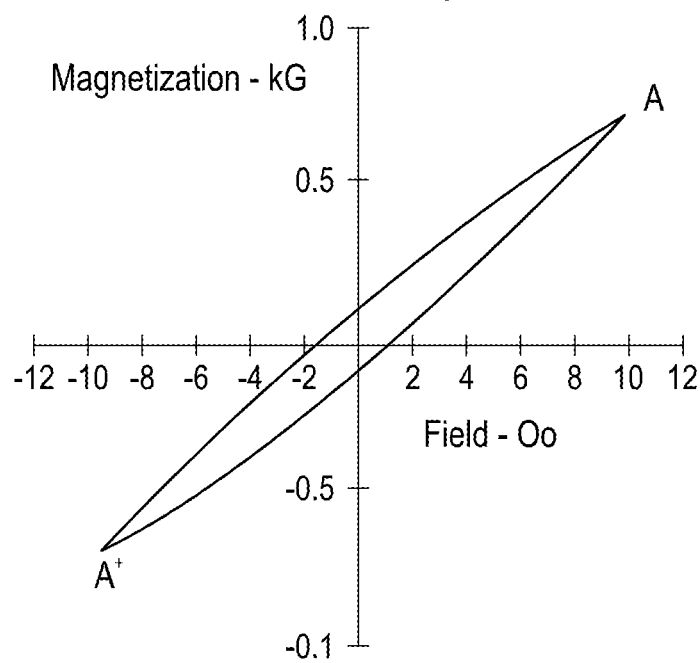

Hysteresis as observed in torque sensors can act in either the same polarity as that in which the applied torsional stress develops a magnetization in the sensing region, or in the opposite polarity. It is useful to consider a standard BH curve for a ferromagnetic material as shown in FIG. 6 given the fact that magnetic fields arise from the active circumferentially magnetized region of the shaft and these fields pervade not only the space in the sensing region where the field sensor(s) is located but also the space occupied by the shaft itself, which can be described as non-active but magnetize-able proximate material. Ferromagnetic materials are readily characterized by the magnitude of the magnetization changes induced by magnetic fields. Since these characteristics are not single valued functions, they are conveniently described by a plot of magnetization M versus field H, as H is cyclically varied over a symmetrical bipolar range. The salient features of such a "major" hysteresis loop are indicated in FIG. 6A, wherein the limiting fields are sufficient for the magnetization to show signs of approaching saturation. The "minor" loop is just as relevant, such as that shown in FIG. 6B. Even for small excursions of an applied field, the resulting magnetization alterations are seen to include some irreversibility, or finite remanence and coercivity. This is relevant to the sensor as non-active regions will be exposed to some field from the active regions, and by virtue of the finite remanence and coercivity of the material comprising these regions, the resulting magnetization in the non-active regions will vary in a hysteretic fashion with applied torque. As a result, these previously inactive, newly magnetized regions themselves contribute field components in the sensing region and around the shaft. Furthermore, for excursions of magnetization in the active region based on applied torsional stress to the shaft, non-active proximate material can become remanently magnetized. Upon relaxing torque and thus the magnetization to an unloaded condition, magnetization will be present in the opposite direction to that created by the applied torque. Applying symmetrical loading cycles in which non-active regions become remanently magnetized, in which the magnetic field emitted from the remanently magnetized non-active regions is a measureable portion of the total magnetic field in the sensing region, will result in a hysteresis loop having a clockwise orientation (CW) often designated as hysteresis having a negative polarity. See also Garshelis and Cuseo (2009).

As described in U.S. Pat. No. 6,260,423, which again describes a "collarless" transducer, as the coercivity of standard plain carbon and low alloy steels are typically in the range of 5 to 50 Oe, and as the coercivity required to rotate the magnetization through vector rotation is beyond 500 Oe, the principal process by which magnetization is altered in these materials is not vector rotation but, rather, domain wall motion that is subject to domain wall pinning. While not wishing to be bound to a particular theory, should domain-wall motion be responsible for the change in magnetization (based on domain wall pinning), upon relaxing torsional stress and thus the magnetization to an unloaded condition, some magnetization will remain present acting in the same direction as that created by the originally applied torque. Should sufficient torsional stress be applied, domain wall motion will be eliminated as a way to change magnetization. Applying loading cycles to a shaft within a range of torsional stresses that exhibit domain wall pinning will result in a hysteresis loop having a counter-clockwise orientation (CCW) often designated as hysteresis having a positive polarity in which the maximum magnitude of the hysteresis is dependent upon the magnetization and material characteristics.

Figure 7A:
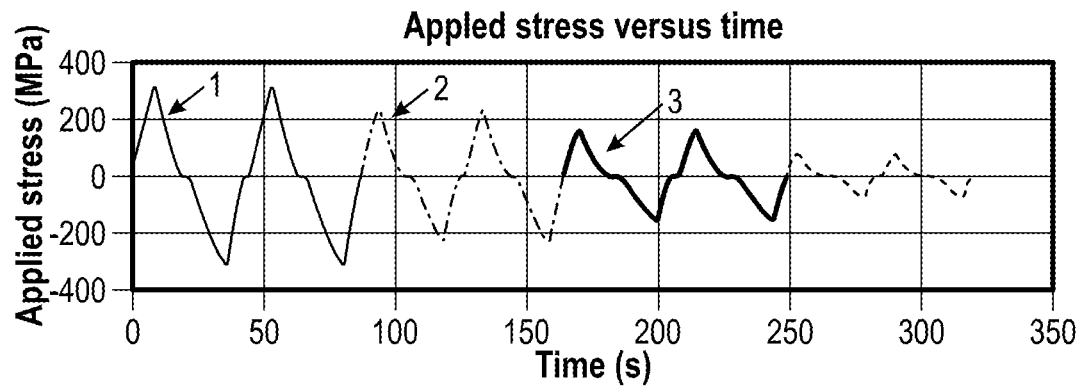
FIGS. 7A-7C shows three graphs.
Figure 7B:
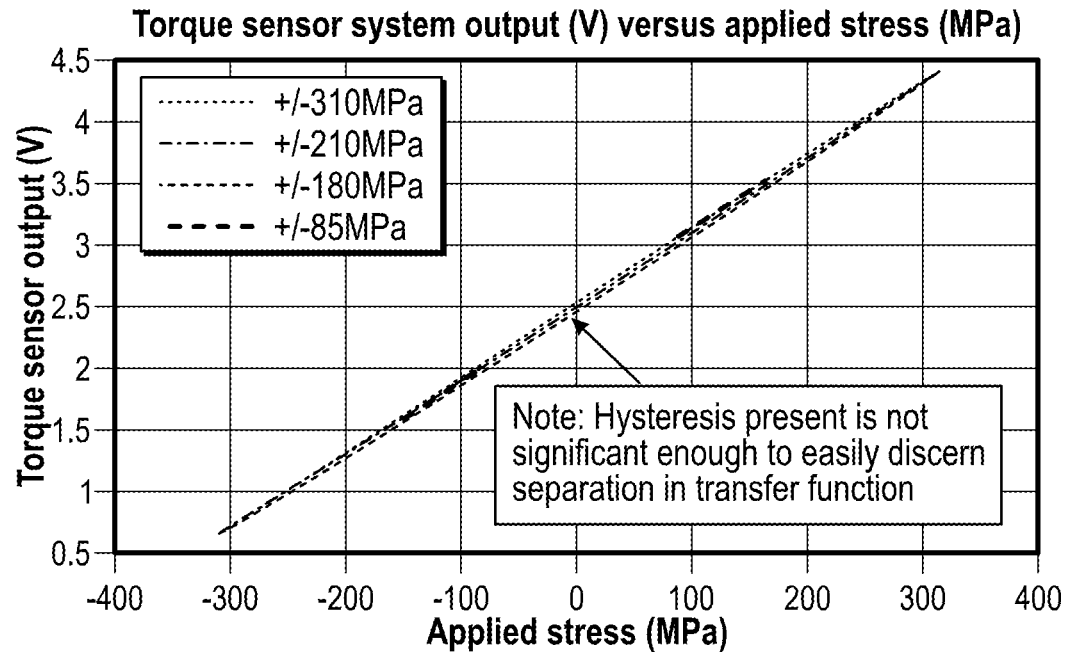
Figure 7C:
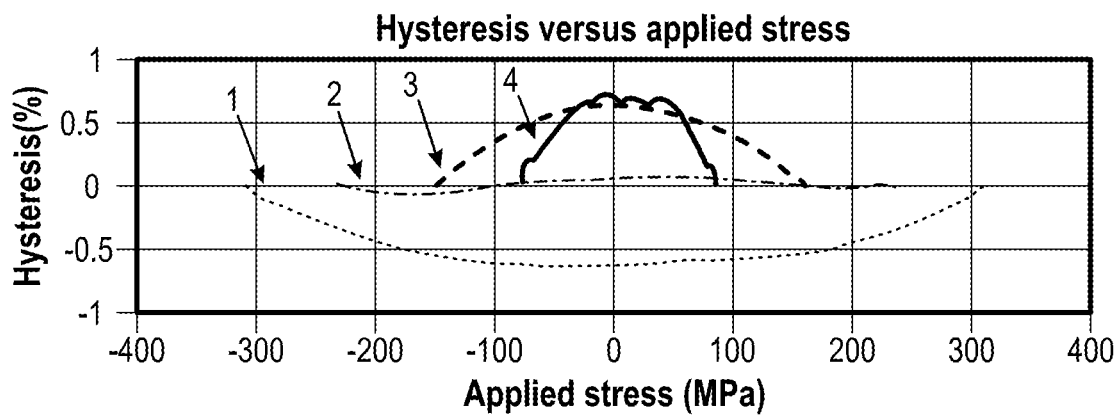

These two described mechanisms of hysteresis responsible for negative and positive hysteresis, respectively, are evidenced by specific loading profiles that can be applied to selectively produce transfer functions with: positive hysteresis, negative hysteresis, or minimal hysteresis by balancing the positive and negative hysteresis. An example of this is shown in FIG. 7, in which FIG. 7A is a plot of the applied torsional stress as a function of time, in which a major loop consisting of two torque cycles is applied from 300 MPa to −300 MPa indicated by "1". This is followed by three minor loops consisting of two torque cycles each of 210 MPa to −210 MPa indicated by "2", 180 MPa to −180 MPa indicated by "3", and then 85 MPa to −85 MPa indicated by "4". FIG. 7B shows the transfer function of the output signal of the torque sensor system as a function of the applied torsional stress. FIG. 7C is a plot of hysteresis as a percentage of the full-scale range defining the loop. It can be noted that the hysteresis is of a positive polarity for loops defined by lower peak magnitudes of applied torsional stress indicated by "3" and "4", whereas as the peak magnitude of applied torsional stress increases, the percentage of hysteresis decreases, ultimately switching from positive polarity to negative polarity.

3. Measurement Error is Repeatable and Deterministic

This invention recognizes that the hysteretic component in the measured magnetic field as well as the temperature dependent changes in the transfer function (of the measured magnetic field versus applied torsional stress to the transducer) for magnetoelastic-based torque sensors and hysteresis in torque sensors based on other constructions is repeatable and deterministic. If the measured hysteresis is characterized over a finite number of applied torsional stress cycles to the transducer shaft, which characterization can be described as major and minor loops, as well as characterized for conditions that influence the hysteresis, such as temperature, should a new torsional stress be applied to the shaft and the temperature considered, the magnitude and polarity of hysteresis can be predicted and thus compensated for. Another factor to consider, while negligible for certain particular magnetic field and strain measuring devices, should the magnetic field measuring device induce its own hysteresis on the measurement of magnetic field, is the fact that it, too, would contribute to the hysteretic component in the measured magnetic field, which can also be found to be repeatable and deterministic.

Figure 8A:
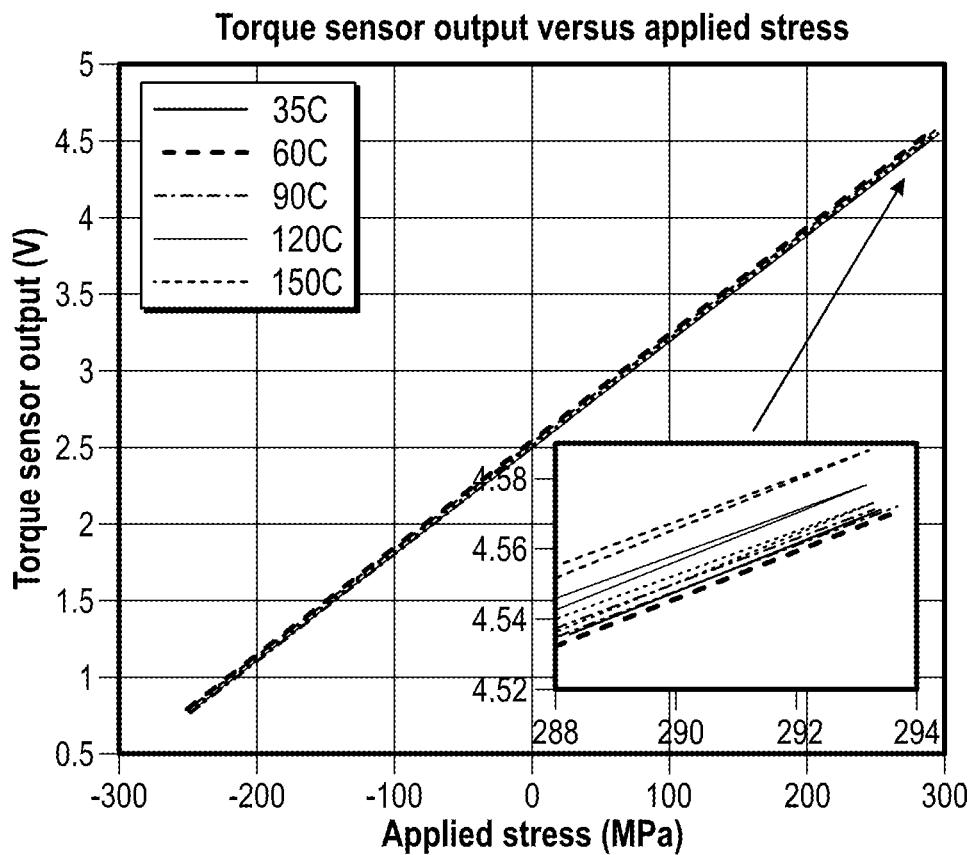
FIGS. 8A and 8B shows two plots.
Figure 8B:
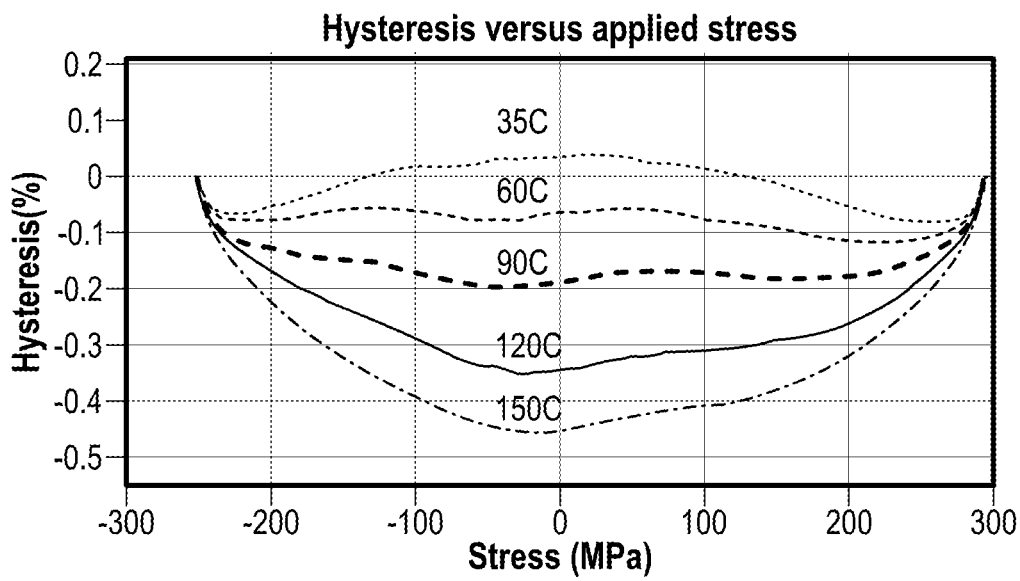

In order to be deterministic, the hysteretic component and temperature dependent changes need to be repeatable. With respect to the application of quasi-static torsional stress cycles under the same conditions, in practice the output has been shown to be repeatable with applied cycles. Examples of this can be seen in FIGS. 1, 4, 5, and 7, as each plot shows two cycles applied, in which the hysteresis is observed to be nearly identical during each applied cycle. Applying additional cycles does not influence the hysteresis. On the other hand, a difference in the characteristics of hysteresis will be observed if torsional stress cycles are applied at a different temperature. An example of the influence of temperature upon hysteresis is shown in FIG. 8, in which the measured magnetic field is plotted as a function of the same torsional stress cycles for increasing temperatures. As shown in FIG. 8B, the polarity of hysteresis is positive at 35° C. but becomes increasingly negative as temperature increases. The influence of temperature on hysteresis can also be shown to be repeatable, such that the same hysteretic component would be observed if the same history of torsional stress and temperature were to be applied.

Although not found in typical situations, there may be circumstances, such as when requiring extremely high accuracy from the torque transducer, in which hysteresis may be found to have a time-related component; however, it may also be found to be repeatable and deterministic. A time-related component of hysteresis may not be unexpected, based on the following phenomena in magnetic materials: (i) dis-accommodation, which is a time dependence of permeability associated with the diffusion on ions through the ferrite lattice of the transducer material; (ii) settling time and relaxation associated with the duration the load is applied; and (iii) eddy currents that act to limit the magnitude of rapidly changing magnetic fields.

There are additional considerations that may also be taken into account that may not easily be quantified. Examples include the presence of local magnetic fields, local permeable material in which the permeability may be dependent on a parameter not being measured and quantified, and compressive or tensile stresses applied to the shaft that may be seen to influence the characteristics of hysteresis.

4. Models of Hysteresis

As has been described, the hysteretic component of the measured magnetic field is repeatable and deterministic, but in order to use this for signal correction, a model of hysteresis is required that can be used to calculate the expected hysteretic component using the measured signal from the torque transducer as at least one of its inputs. There is no paucity of technical papers describing models that have been developed to model hysteresis. While other approaches have been described (see, e.g., Dupre, et al., (2001)), most modeling efforts either can be categorized as differential equation models or continuous operator models that are a function of history. Examples of differential equation models are: the Bouc-Wen model (Ikhouane and Rodellar (2007)); the Duhem model (Visintin (1994)); and the Jiles-Atherton model (Jiles and Atherton (1986)). The Preisach continuous operator model was first suggested in 1935 (Preisach (1935)), and is designed to model a hysteresis loop as nonlinear relay operators called "hysterons" uniformly distributed on a Preisach $\alpha$, $\beta$ plane, with a Preisach triangle defined and bounded by the $\alpha$, $\beta$ line. Each hysteron is modeled as a relay with its on/off state defined by specific thresholds with weights assigned according to its state, in which the weighting is often defined using a density function.

While all models use different approaches and methods, all methods start with measuring and storing the variation in the system output as an input increases from a specified minimum to a specified maximum and then from maximum to minimum values. Hysteresis is manifested by the non-coincidence of the ascending and descending data sets. When the gathered data is plotted, the lines connecting the data points respectively comprise ascending and descending limbs of a major hysteresis loop. Similar measurement and data storage of first order transitions (e.g., changes in direction as the input was increasing from its specified minimum before the maximum is reached, and changes in the direction as the input was decreased from its maximum before the minimum is reached) are also typically performed. Similar measurements and data storage may also be made on second order transitions (when the direction of input variation following a first order transition is again reversed before the input reaches the extreme value in its new direction). Plotted data following such transitions describe "minor loops". From this experimental data, parameters are estimated to create a suitably accurate model of the complete input versus system output transfer function.

5. Application to Torque Transducer Signal Correction

For torque sensor systems that operate across typical limits of applied torsional stress (e.g., less than 150 MPa applied torsional stress) that use materials such as AMS 6265 or AMS 6419 and operate in the temperature range of 20° C. to 80° C., experimental data has shown the hysteretic component of the measured magnetic field is well described by a Preisach model with a uniform hysteron density, which can be implemented without computationally intensive algorithms. Within these limits, there has also not been an indication that there are significant deviations from the model based on non-ideal conditions such as (i) reptation, which would be observed as hysteresis being dependent on the number of loading cycles applied, (ii) saturation, (iii) asymmetry, which would be observed as hysteresis being dependent on the polarity of the load applied, or (iv) time influences, such as a dependence on the rate at which the torque is applied to the transducer shaft. Given the good fit provided by the Preisach model, other predictive models, including the previously referenced models (e.g., Jiles-Atherton), can also be applied to model the hysteretic component of the measured magnetic field responding to an applied torsional stress. It is also worth noting that the input into the model need not be limited to the measured magnetic field, and can include other parameters that are correlated or associated with applied torque and the hysteretic component such as, for example: (i) measurements of displacement; (ii) a measurement of time, such as in the case of reciprocating systems in which time can be related to the applied torque; or (iii) external events such as the opening of a valve that may result in a well-quantified change in applied torque. As the model of hysteresis computes the magnitude and polarity of the hysteretic component dependent on the input of applied torsional stress (or magnetic field, or other parameter that correlated with applied torque, such as a measured displacement, element of time in a reciprocating system, etc.) should the hysteresis be relatively small (for example, less than about 5%), the uncompensated sensor output is able to provide the input directly into the model. In such cases, the computational result of the applied model of hysteresis can be inverted in polarity and be directly superimposed on the measured magnetic field. If the hysteresis is significantly large such that the measurement of the applied torsional stress is significantly flawed, or the non-ideal conditions mentioned above are seen to be significant factors, a more numerically involved model (such as, for example, a Preisach model with non-uniform hysteron density or a rate-dependent model such as the Bouc-Wen model) is preferably employed for compensation.

As described by the Preisach model, the active area of the Preisach triangle is defined as that represented by the limits between the minimal extrema or the value of alpha at the previous negative-to-positive transition and current α. Area representing history is held prior to each negative-to-positive transition. Should α descend below a previous negative-to-positive transition, or ascend such that the current β is greater than that of a previous positive-to-negative transition, the Preisach model uses a "wiping out" function such that this previously generated area is either eliminated or absorbed. When considering the active area of the Preisach model, when ascending the hysteresis loop (increasing value as compared with the previous point) the area of integration is a triangle bounded by: (i) the α, β line; (ii) a is bound by the previous negative-to-positive transition (or minimal extrema) and current value α; and (iii) β is bound by the previous transition and current value of β.

When descending the hysteresis loop, the area of integration is a parallelogram bounded by: (i) the α, β line; (ii) α is bound by the previous negative-to-positive transition and the current value of α; and (iii) β is bound by the positive-to-negative turning point.

An example of the Preisach algorithm is shown in FIG. 9, in which five inputs (α) are considered: $\alpha_1=0$; $\alpha_2=2000$; $\alpha_3=1200$; $\alpha_4=1800$; and $\alpha_5=0$, in which these units can represent any digital quantity (e.g., torque, bits, Volts, etc.). Although five points are considered, just as torque changes continuously but is sampled in small but finite steps (dependent upon the acquisition rate of the signal), the values between these points are also considered, calculated in steps of 2 units in this example (e.g., 0→42000 is calculated at 0, 2, 4, 6, . . . 2000).

FIG. 9 consists of 12 plots (FIGS. 9A-9L), in which each column represents the current value when moving from α to $\alpha_t+1$ (e.g., plots A, E, I represent $\alpha_1=0$ to $\alpha_2=2000$). The first row (FIGS. 9A, B, C, and D) is a plot of the α, β line and area represented on the Preisach plane for the current value of α. The second row (FIGS. 9E, F, G, and H) represents the area computed divided by the full-scale value of α. The third row (FIGS. 9I, J, K, and L) rotates the normalized area such that it is fitted about the abscissa. As shown in FIG. 9A, moving from an input of 0 to 2000, the area is integrated bound by the α, β line with limits of integration defined by α and β, with the resulting area being represented as a triangle. FIG. 9 demonstrates that the hysteresis at α=0 is the same as at α=2000, such that the ascending limb of the major loop has been traversed. As shown in FIG. 9B, moving from an input of 2000 to 1200, the area is effectively removed bound by the α, β line with limits of integration defined by α and β leaving the parallelogram as shown. As shown in FIG. 9C, moving from an input of 1200 to 1800, area is again added; however, the parallelogram from FIG. 9B remains acting as a "memory" of the previous history of inputs. The new area is added as a triangle defined by the turning point at 1200 and limits of integration defined by α and β. FIG. 9C demonstrates the hysteresis is again approaching 0.

Figure 9A:
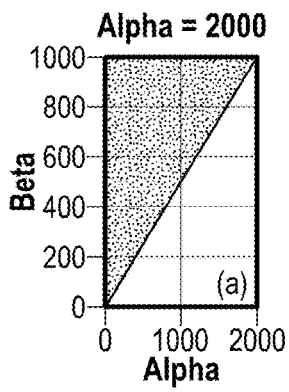
FIGS. 9A-9L shows 12 plots demonstrating a Preisach model for discrete input values.
Figure 9B:
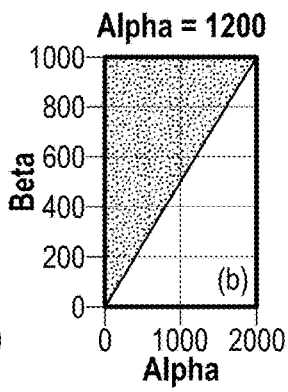
Figure 9C:
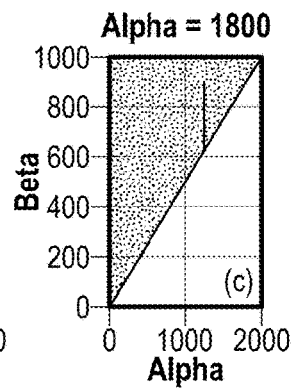
Figure 9D:
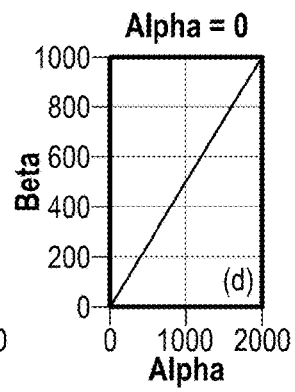
Figure 9E:
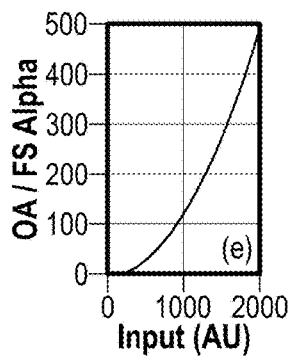
Figure 9F:
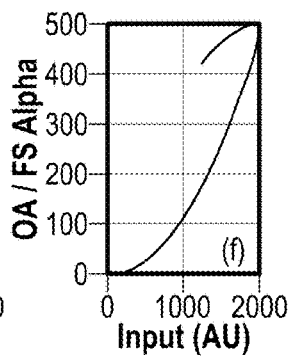
Figure 9G:
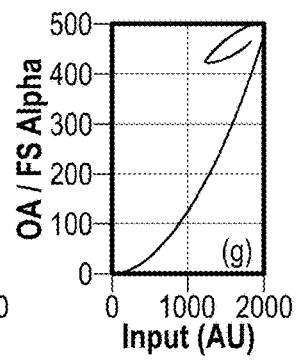
Figure 9H:
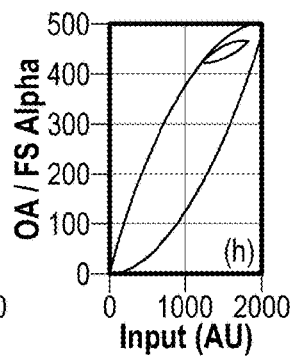

As shown in FIG. 9D, moving from an input of 1800 to 0, all area is wiped away, thus completing the descending limb of the major loop.

Figure 9I:
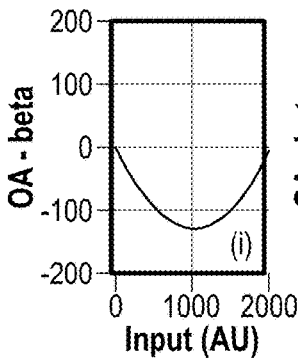
Figure 9J:
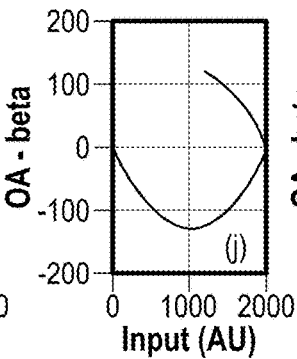
Figure 9K:
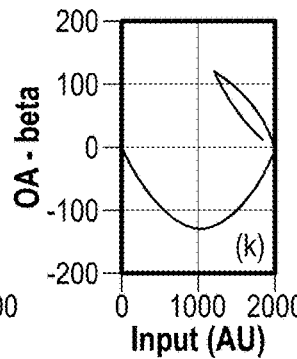
Figure 9L:
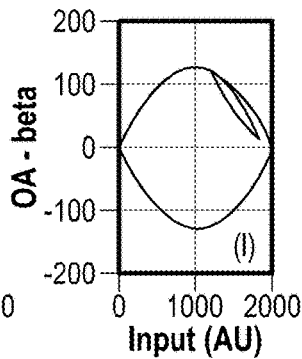

It is clear from FIG. 9I that the output of a descending segment is clearly different from that of an ascending leg of hysteresis. For conditions in which a uniformly weighted hysteron density function is an appropriate fit and the error between the applied torque and the measured torque is small (e.g., less than 5% deviation), the Preisach model as described only requires two parameters to be applied to scale it to an experimentally determined hysteresis curve: (i) the range of the input signal and thus the major loop, which sets the full-scale value of a; and (ii) the magnitude of hysteresis present in the major loop as a function of the span of α, which is used to set the density function in the traditional model. Alternatively, the magnitude of hysteresis can be used to adjust the slope of the α, β line when using a uniform density function, resulting in the computational demands of running the model to be significantly decreased as the density function need not be computed on an element-by-element basis; instead, simple trigonometry can be used to solve for the total area present. The third row of FIG. 9 (FIGS. 9I-L) can be inverted and superimposed directly onto the signal with hysteresis, thus removing hysteresis from the signal. An example of the described method being applied to compensate for hysteresis is shown in FIG. 1.

6. Addressing Departures from Standard Models

While hysteresis in a torque sensor system can often be well-described using a specific, uniformly weighted distribution, as the torsional stress applied to the shaft or temperature is significantly increased, the hysteresis observed in the torque sensor as a function of the history of torsional stress changes significantly, such that applying the originally applicable weighted distribution will result in at best, a less than ideal fit of the actual hysteresis, but at worst will yield significant inaccuracies between the model and the actual data. While a traditional non-uniform density function can be applied to fit data obtained at higher temperatures and torsional stresses, depending upon the processing power available, it may prove more practical to continue to use a uniform density function in which the slope of the α, β line is used to control the magnitude of hysteresis being compensated for, but: (A) bounds are placed on the input range of the hysteresis compensation algorithm. This is equivalent to using a non-uniform density function, in which the density is set to 0 after a specific input; (B) a second model dedicated to events that the primary model cannot easily describe is employed; and (C) the slope of the α, β line is adjusted as a function of temperature or other environmental variables, rather than modify the weighting of the density function. The output area for a given input will be proportional to the slope of the α, β line, which is equivalent to changing the average uniform density when applying a density function.

Figure 10A:
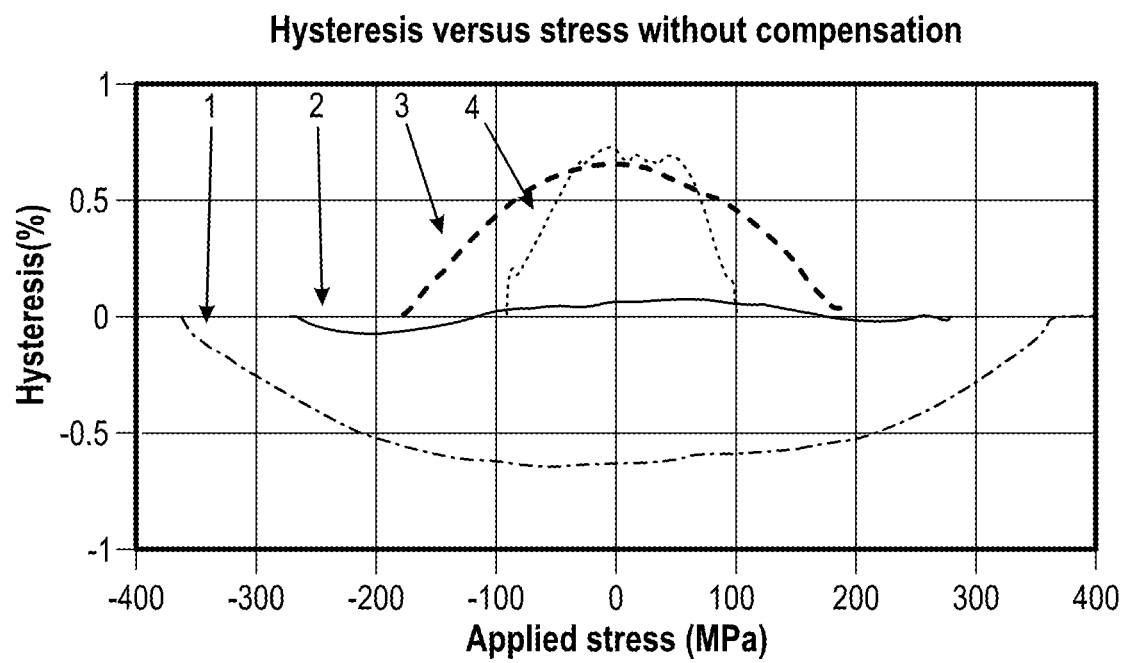
FIGS. 10A and 10B shows two plots.
Figure 10B:
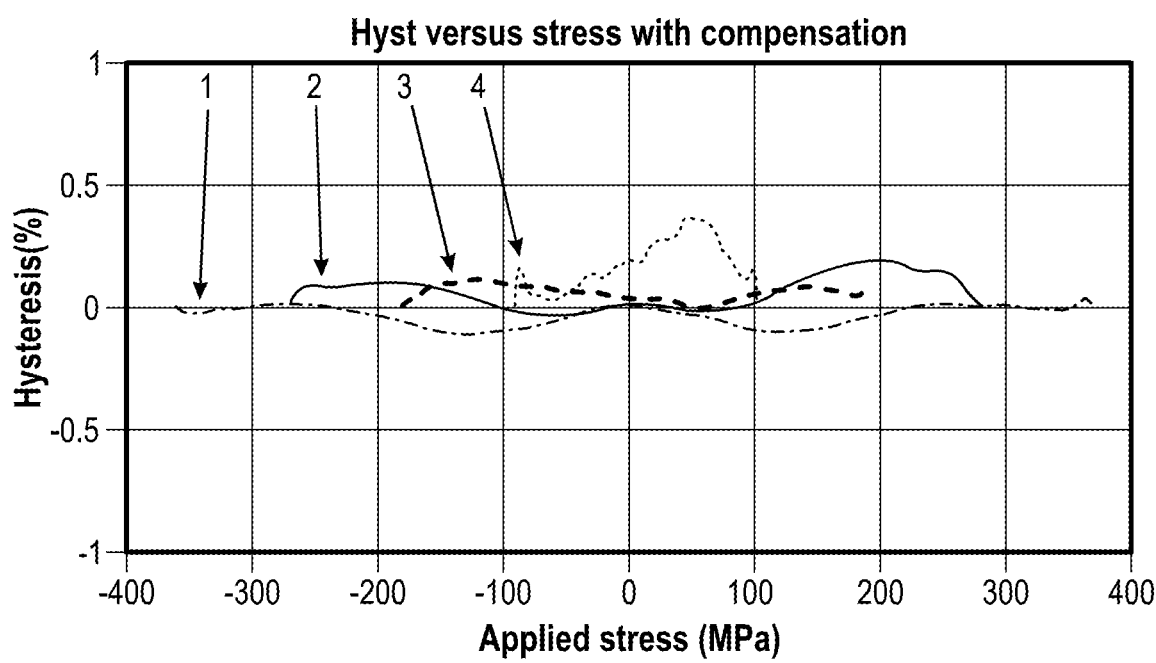

With respect to the influence of increasing magnitude of torsional stress, consider FIG. 7, in which hysteresis is positive for a minor loop, such as those indicated by "3" and "4", but becomes increasingly negative as the applied torsional stress is increased on subsequent cycles indicated by "1" and "2". To handle such conditions, (A) and (B) (above) can be employed. As it is observed that positive hysteresis is only present for a limited range of torsional stress, the input into the hysteresis compensation model can simply be bound to a finite range. As described in (A), this is equivalent to using a non-uniform density function, in which the density is set to 0 after a specific magnitude. As negative hysteresis develops only after the input exceeds a certain range, a secondary model can be used that is as straightforward as superimposing a finite value onto the output of the primary model, in which the secondary model's finite value is a function of the maximum excursion of torsional stress and temperature. The magnitude of this secondary model's output is only relaxed after the polarity of the input is reversed. These two methods are applied to the data first shown in FIG. 7. FIG. 7A is copied into FIG. 10A, in which the results of applying compensation to this data are shown in FIG. 10B.

Figure 11A:
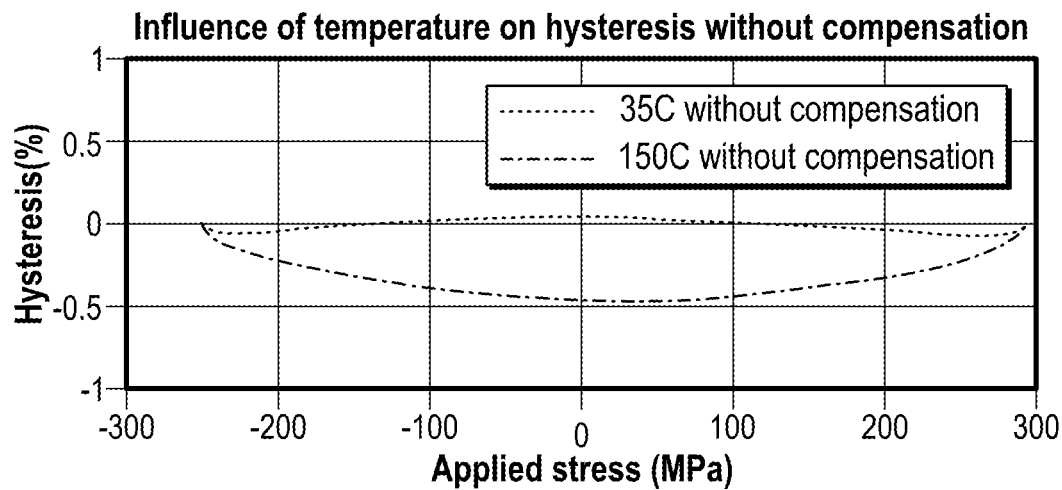
FIGS. 11A and 11B shows two plots.
Figure 11B:
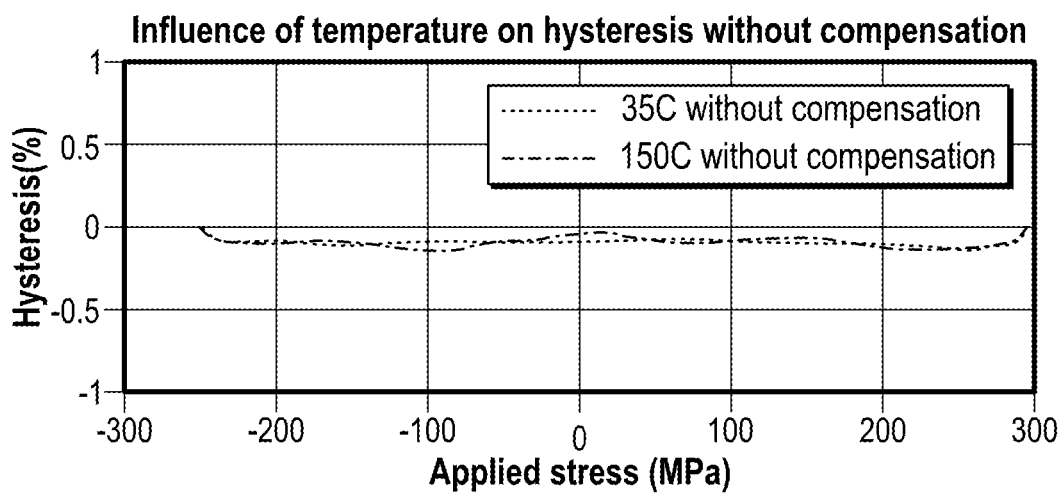

As for the influence of increasing temperatures, consider FIG. 8, which demonstrates that the polarity of hysteresis is initially positive but becomes increasingly negative for increasing temperatures. To handle such changing conditions, both (B) and (C) (above) can be employed. As the magnitude of hysteresis is decreasing as temperature increases, the slope of the α, β line can be decreased as a function of temperature. The same secondary model as in the previous example can also be employed, but the threshold dictating when the secondary model is applied can be adjusted as a function of temperature. As shown in FIG. 11A, the two methods are applied to the data first shown in FIG. 8, but only consider the temperatures of 35° C. and 150° C. The compensated output is shown in FIG. 1B; the influence of hysteresis that is a function of temperature is reduced from about 0.5% magnitude to less than about 0.2% magnitude.

7. Requirements for Real Time Signal Correction

While hysteresis models and compensating methods of simulated/experimental data have been described, there are several presumptions in the acceptance of the output signal of a system utilizing signal correction as an improved indicator of the actual torque, due to the input into the signal correction model being a valid measurement. These include: (i) the bandwidth of the torque sensing system must be sufficient to measure the actual applied torque amplitude, when applied at any rate. For particular shaft materials or constructions of the sensor, eddy current and time effects need to be negligible. For example, enclosing the sensor or shaft in a conductive material such as brass is likely to lead to a significant time effect or attenuation of the measured magnetic field that is a function of frequency; (ii) the measurement of the magnetic field or input into the model needs to be nominally free of electrical noise or spurious inputs, as these appear as inputs into the model that will result in a response from the output of the signal correction algorithm; (iii) the system must be capable of performing the hysteresis compensation algorithm quickly enough that any torque excursion(s) is (are) quantified and processed regardless of how quickly it is (they are) applied; and (iv) compensation of hysteresis requires continuous acquisition of the sensed quantity. If, for example, a torque is applied, relaxed, or otherwise changed when the sensor and/or compensating electronics are unpowered, the compensator will no longer have the knowledge (information) required to calculate and thus compensate for the hysteresis. Unless (i) the shaft can be brought to one or the other torque extrema to allow the compensator to "reset" itself, (ii) the applied inputs are consistent and repeatable such that default values can be set that are reflective of the operating conditions, (iii) the system will never be powered down, and/or (iv) non-volatile memory is always used, it is necessary to store either the operating state or a history of inputs that allow the operating state to be recreated in non-volatile memory, thereby allowing the current state to be restored upon power-cycling. Otherwise, upon restarting, the inputs into the signal correction algorithm and its subsequent output will not match what is required for proper identification of the state of the torque transducer.

8. Representative Embodiments

Figure 12A:
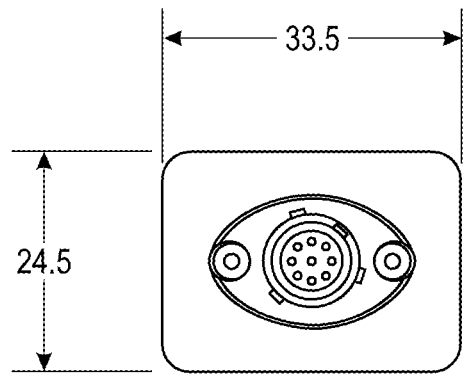
FIGS. 12A-12C shows a device capable of carrying out the accuracy correction procedure in real-time, with units shown in millimeters.
Figure 12B:
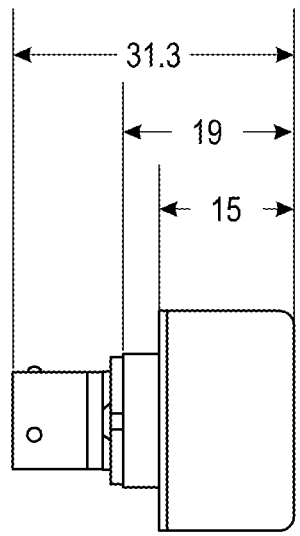
Figure 12C:
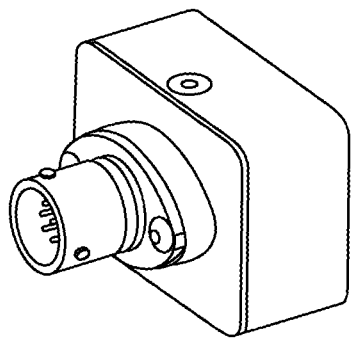
Figure 13:
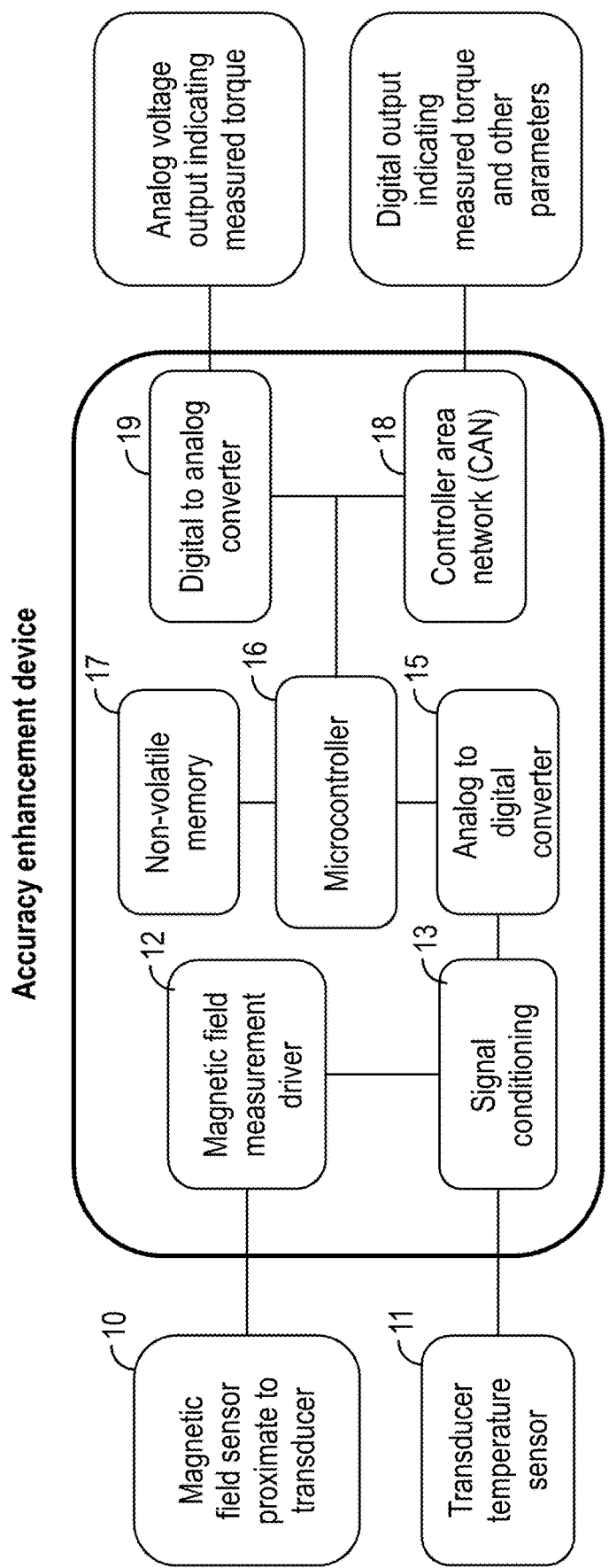
FIG. 13 shows a block diagram of a representative device according to the invention that can implement hysteresis compensation in real-time.

FIG. 12 is a mechanical drawing detailing the dimensions and isometric view of a device according to the invention that contains the magnetic field measurement drivers, signal conditioning, microcontroller, and associated hardware as shown in the block diagram in FIG. 13 required to carry out the signal correction procedure in real-time. Real-time signal correction requires a number of stages of hardware, represented in FIG. 13. The first stage of hardware is the sensing technology indicated by 10, such as a magnetic vector detection device or strain measuring device with associated driver circuitry indicated by 12, in which the measured quantity is a function of torque but also has a component of hysteresis. Optionally, the magnetic field measurement driver may be connected to a microcontroller to carry out a number of tasks, such as providing or influencing clock signals used by the drivers used for the sensing technology. The magnetic field measurement technology must have a bandwidth capable of measuring any significant frequency components present that are indicative of torque without attenuating or amplifying their magnitude. In practice, torsional oscillations and thus the signal may contain frequency components beyond several kilo-Hertz, such that the bandwidth is required to be at least this frequency or higher. The output of the sensing technology is often in an analog voltage or current format, although might also be represented by a frequency or phase, or be directly converted into a digital format.

In particular, when the measured signal is an analog format, signal conditioning electronics 13 are preferably included to properly condition this measured electrical signal for successful conversion into a digital format using an analog to digital converter (ADC) 15. An ADC and signal conditioning may also be used to convert the analog output of other transducers such as temperature sensors 11 into a digital format. The signal conditioning may include but is not limited to adjustments to the span and offset of the signal, as well as applying filtering to remove any frequency components above half the intended ADC sampling rate, as these frequency components would otherwise be aliased. The sampling rate used should be at a minimum of twice the rate of the highest frequency components that are expected to be present (as stated above, often beyond several kilo-Hertz); however, a factor of 10 or more will be ideal as it will allow the peak magnitude of higher frequency components to be precisely quantified. The digital signal should then be available to a computational device such as a microprocessor or Digital Signal Processor (DSP) indicated by 16, capable of carrying out the compensation algorithm, with either internal or external non-volatile memory indicated by 17, and optional volatile memory to execute the algorithm on, in which the digital signal represents the applied quantity of torque with a component of hysteresis.

Figure 14:
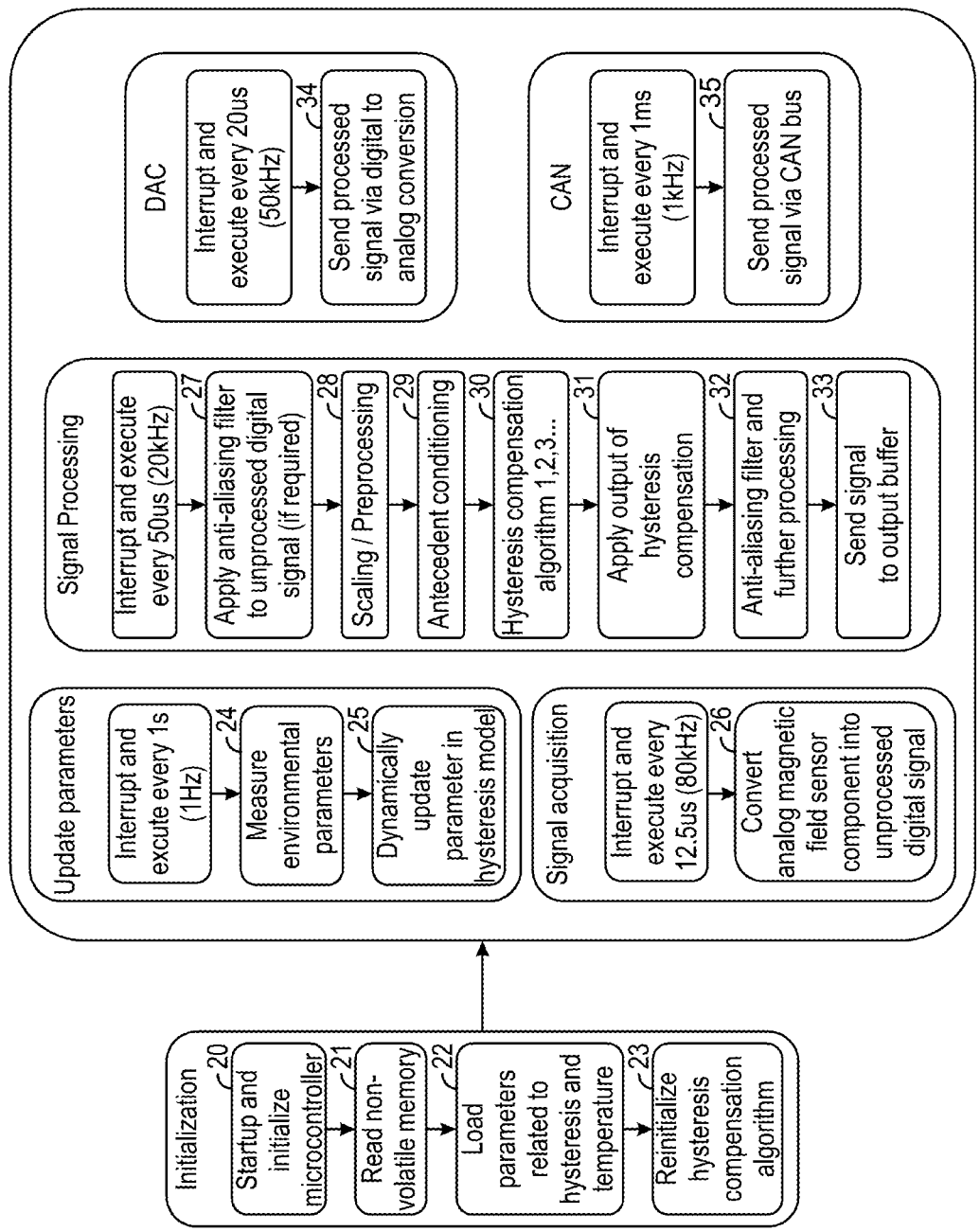
FIG. 14 is an exemplary program flow diagram for implementing methods according to the invention.

This signal can then be passed into a hysteresis compensation algorithm either point-by-point or by providing multiple values to be processed simultaneously. A flow diagram of firmware capable of carrying out the compensation algorithm is shown in FIG. 14. Required by the signal correction algorithm are a number of parameters that are a function of the input torque signal and temperature. These may include, but are not limited to, (i) a density function, (ii) the range over which the positive hysteresis is dominant, (iii) the percentage of hysteresis characteristic of this range, (iv) the range wherein negative hysteresis is observed which may be described as remanent hysteresis, and (v) a scaling factor to define how remanent hysteresis is a function of applied torque. Additional parameters can also be used to provide compensation for effects such as time effects (e.g., eddy currents, influences of reptation or a dependence of hysteresis on the number of cycles applied, etc.).

With respect to obtaining a parameter, the torque sensor transducer to be optimized is preferably subjected to full-scale (or rated capacity) torque cycles followed by several minor loops, often at 75%, 50%, and 25% of the magnitude of the full-scale torque cycle. To account for the influence of temperature on the output of the sensor, the same torque cycles are applied when the shaft and matching sensor are at a different operating temperature. Typically the shaft and sensor are heated to the maximum operating temperature of the sensor, and torque transfer functions are obtained at a variety of different temperatures throughout the test. This data is used to obtain the optimization parameters for the torque transducer with respect to sensitivity and offset of the shaft as a function of applied torque, as well as the various hysteresis compensation parameters that are a function of temperature.

These parameters can be stored in firmware, the non-volatile memory of the hardware, or sent dynamically to the microcontroller through an interface such as CAN (Controller Area Network), such that they can be utilized by the compensation algorithms. Turning to FIG. 14, after powering-on the microcontroller 20, if these parameters are stored on non-volatile memory, they can be read and loaded by 21 and 22. A history of previously applied torques, values of hysteresis compensation, or other related parameters that can be used to reinitialize the hysteresis compensation algorithm 23 can also be read and loaded.

After initializing the microcontroller, timer-based interrupts are preferably used to periodically carry out events associated with the operation of the firmware at a set rate, with operations such as updating temperatures operating relatively slowly such as at a rate of 1 Hz, and the analog to digital sampling of the magnetic field and associated compensations happening relatively quickly (e.g., 20 kHz) allowing rapidly changing torque transients to be captured and processed by the algorithms.

Parameters associated with hysteresis compensation can be changed dynamically based on external inputs or environmental parameters such as temperature (24, 25). Temperature is typically obtained using a temperature sensor built into the magnetic field sensor assembly placed proximate to the torque-transmitting member. The magnetic field is continuously sampled by an ADC 26, and this sampled signal can have further filtering and processing such as temperature compensation applied (27, 28, 29). If the percentage of hysteresis is relatively small (<5%), the hysteretic component can be calculated using the parameters for the model (30), in which the output can be inverted and superimposed onto the measured quantity of torque (31). Alternatively, the measured torque signal can be modified directly. Both cases result in a processed signal in which the measured components of hysteretic and temperature dependent error are removed or diminished. If the hysteresis is relatively large, such that the input to the model as measured by the sensor is not a reasonable estimate, a more advanced or iterative model can be implemented, ultimately also resulting in a processed signal with the hysteretic and temperature dependent error removed or diminished. This processed signal can be manipulated further, by applying scaling, filters, signal processing techniques and tools, or normalizing to specific ranges (32). The further processed signal is then sent to an output buffer (33). Typical transmission methods for this processed signal include but are not limited to using a digital format such as Controller Area Network (CAN; 35), a frequency representing the signal, or restoring this digital signal to an analog voltage or current component (34). The CAN and analog transmission methods are shown in FIGS. 13 (18 and 19, respectively).

Figure 15A:
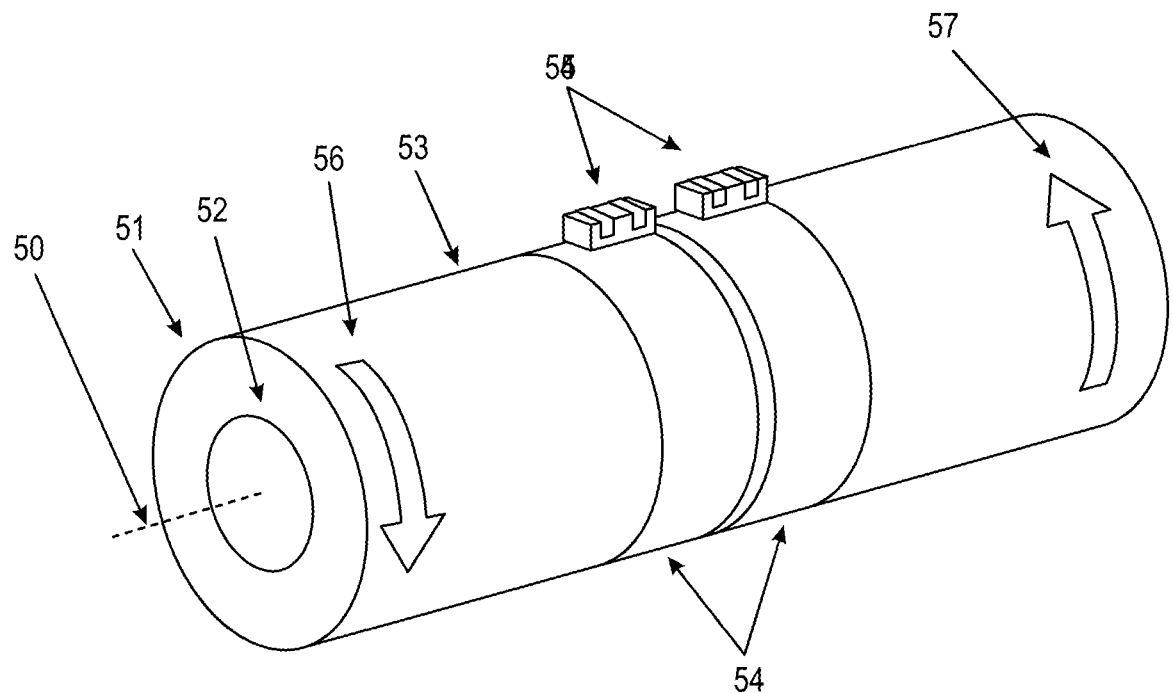
FIGS. 15A and 15B shows two isometric views.
Figure 15B:
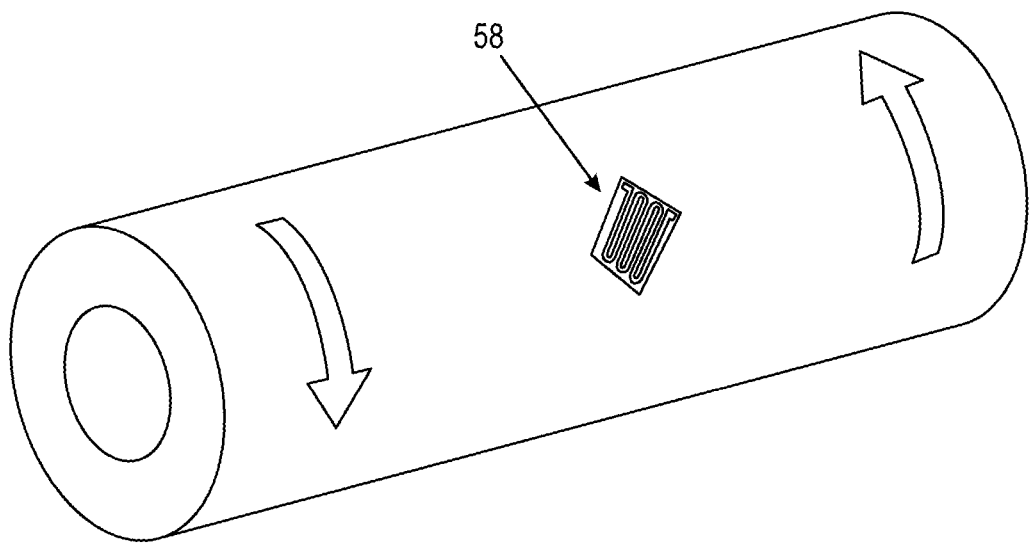

FIGS. 15A and B are mechanical drawings representing a shaft section with centerline 50 with diameters indicated as 51 and 52, respectively, in which the inner diameter is optional. Applied torque is indicated by oppositely oriented arrows 56 and 57, which produces a shear stress, strain, and subsequent angular twist in the shaft. In a preferred embodiment as represented by FIG. 15A, the shaft is magnetized to have one or more bands of remanent magnetization 54 (in alternative embodiments, magnetized rings or hoops could be attached to the shaft). One or more sense elements 55 located proximate to the shaft provide a signal indicative of the torque applied to the shaft. Optionally, in an embodiment as represented by FIG. 15B, one or more strain-sensitive elements (e.g., strain gauges) 58 are used to provide a signal indicative of the torque applied to the shaft. The strain-sensitive element(s) is(are) preferably located along or orthogonal to the principal stress direction for torsional shear, which is oriented at 45° relative to the axis of the shaft. The strain-sensitive element(s) can be excited either through direct contact or without direct contact (e.g., surface acoustic wave or wireless telemetry). Optionally, the total shear strain or angular displacement of the shaft or section of the shaft can be measured as a signal indicative of an applied torque to the shaft.

Figure 16:
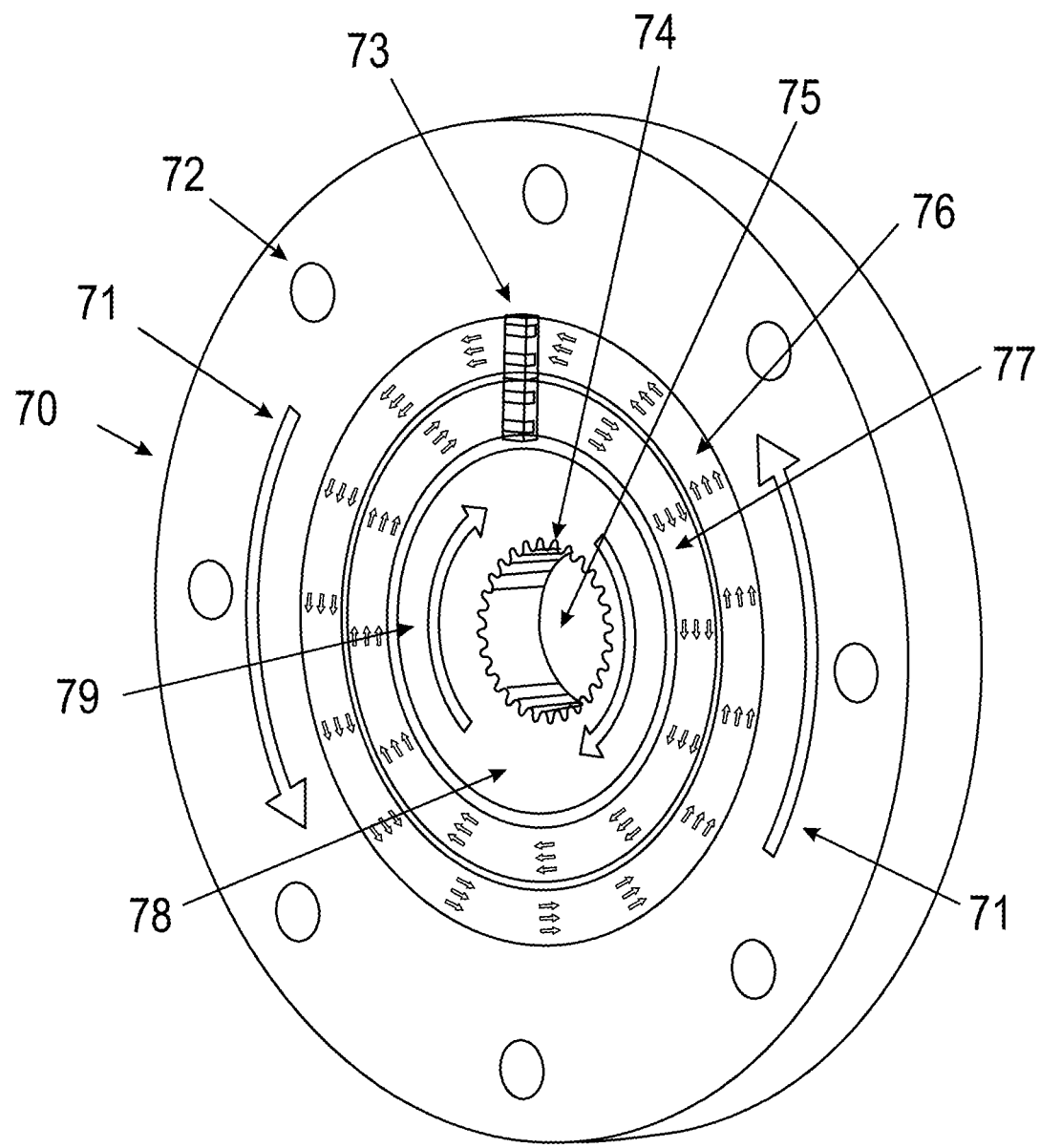
FIG. 16 shows an isometric view representing a disk transmitting torque, in which the disk features band(s) of remanent magnetization and proximate sense elements to provide a signal indicative of torque.

FIG. 16 is a mechanical isometric view representing a disk or flange as indicated by 70 with centerline 75 undergoing torsional stress and subsequent strain reapplied at an inner diameter such as from a spline or inner bolt hole circle. The disk is not necessarily a constant cross section, and may be profiled across its radius as indicated by 78 to provide a preferred stress distribution across its radius. In this representative embodiment, a spline 74 is used to apply torque that is transferred radially outwards. In preferred embodiments, the torque is transferred to an adjacent member via a clamping force applied from fasteners located through a bolt-hole circle indicated by 72, or optionally splines, gears, or other mechanical features, in which the reaction torque is indicated by 71, such that the disk is under torsional stress as indicated by 71 and 79. In a preferred embodiment, the disk is magnetized to have one or more bands of remanent magnetization as indicated by 76, 77. One or more sense-elements represented by 73 located proximate to the disk provide a signal indicative of the torque applied to the shaft. Optionally, one or more strain sensitive elements (e.g. strain-gauges) can be used to provide a signal indicative of the torque applied to the shaft.

Figure 17A:
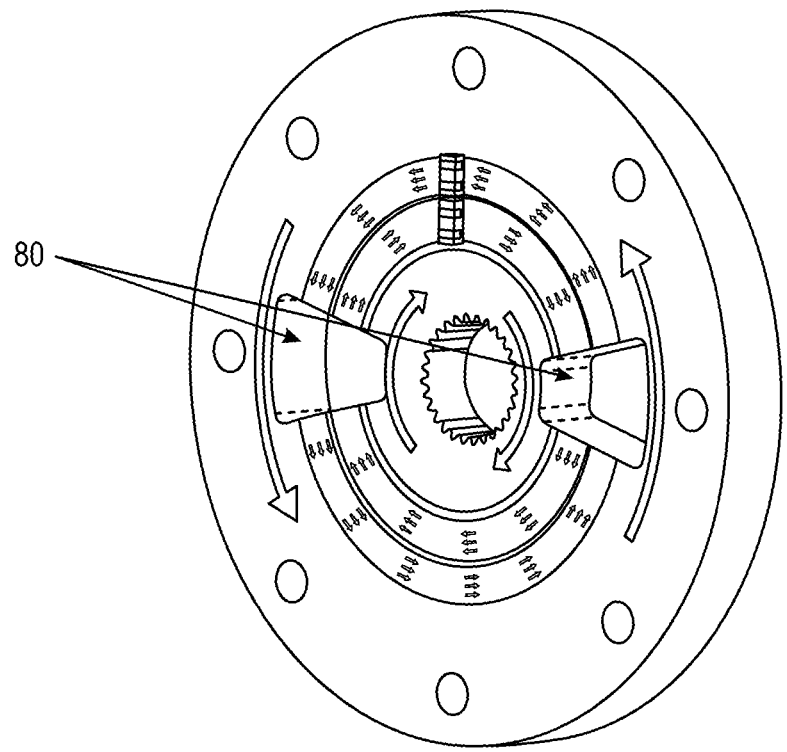
FIGS. 17A-17B shows one isometric view (FIG. 17A) and one projection view (FIG. 17B).
Figure 17B:
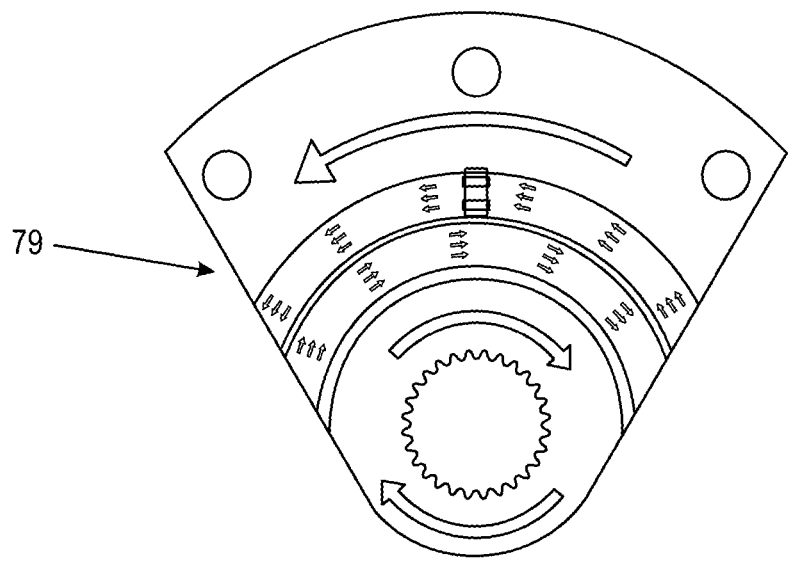

FIGS. 17A and B are mechanical isometric views representing the disk or flange of FIG. 16, but indicate the member does not necessarily need to be continuous about its circumference, as represented by 79, 80 in particular on embodiments in which the disk or flange is not intended to rotate.

9. Further Considerations

Models for hysteresis of magnetic materials are known and well described, such as models to fit standard B-H loops (for example, see FIG. 6), as well as the application of models and the inverse of models applied to the control of piezoactuators and giant magnetostrictive materials used for displacement sensors. It was unexpected that these models and methods would have been found to also be applicable to torque transducers, in particular given that torque transducers have been observed to have components of positive and negative hysteresis, which components are dependent on temperature, applied stress, and the history of applied stress. It was also originally expected that the influence of time effects such as eddy currents and reputation, as well as their potential dependence upon temperature, would have made the application of a corrective algorithm impractical, in particular when applied to a real-time system. However, significant development and testing has surprisingly shown that when these methods are combined with temperature-dependent parameters and implemented in real-time, the accuracy of torque sensor systems can be significantly improved. All of the articles and methods disclosed and claimed herein can be made and executed without undue experimentation in light of the present disclosure. While the articles and methods of this invention have been described in terms of preferred embodiments, it will be apparent to those of skill in the art that variations may be applied to the articles and methods without departing from the spirit and scope of the invention.

All such variations and equivalents apparent to those skilled in the art, whether now existing or later developed, are deemed to be within the spirit and scope of the invention as defined by the appended claims. It will also be appreciated that computer-based embodiments of the instant invention can be implemented using any suitable hardware and software. All patents, patent applications, and publications mentioned in the specification are indicative of the levels of those of ordinary skill in the art to which the invention pertains. All patents, patent applications, and publications are herein incorporated by reference in their entirety for all purposes and to the same extent as if each individual publication was specifically and individually indicated to be incorporated by reference in its entirety for any and all purposes.

The invention illustratively described herein suitably may be practiced in the absence of any element(s) not specifically disclosed herein. Thus, for example, in each instance herein any of the terms "comprising", "consisting essentially of", and "consisting of" may be replaced with either of the other two terms. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

Bibliography

Lee, Seong-Jae. Magnetic torque sensor for transmission converter drive plate. U.S. Pat. No. 8,424,393. 2013.

Ang, Wei Tech, Francisco Alija Garman, Pradeep Khosla, and Cameron N. Riviere. "Modeling Rate-dependent Hysteresis in Piezoelectric Actuator." *Institute for Software Research, Paper* 516, 2003.

Belanger, Adrian, and Ram Narayanan. "Calculation of Hardness Using High and Low Magnetic Fields." ECNDT-Tu4.1.1. Berlin, 2006. 1-9.

Boley, Mark S., Doug A. Franklin, and Jason T. Orris. "The effects of chromium concentration on magnetically polarized heat-treated steel torque transducer shafts." *MMM*, 2004.

Boley, Mark, Doug Franklin, and David Rigsbee. "Heat treatment effects on sensitivity and hysteresis loops of magnetoelastic torque transducers." *J. Appl. Phys.*, 2000.

Brokate, Martin, and J. Sprekels. Hysteresis and Phase Transitions. Springer, 1996.

Chandler, Harry, ed. Heat Treater's Guide: Practices and Procedures for Irons and Steels. ASM International, 1994.

Cripe, David. Fabrication of a magnetoelastic torque sensor. U.S. Pat. No. 7,401,531. 2008.

Cripe, David. Reduction of hysteresis in a magnetoelastic torque sensor. U.S. Pat. No. 7,308,835. 2007.

Cripe, David W. Method of eliminating hysteresis from a magnetoelastic torque sensor. U.S. Pat. No. 7,350,425. 2008.

Dupre, L. R., R. Van Keer, J. A. A. Melkebeek, Y. I. Moroz, and S. E. Zirka. "Hysteresis Models for Transient Simulation." In *Scientific Computing in Electrical Engineering*, 105-106. Berlin: Springer-Verlag, 2001.

Garshelis, Ivan J. Circularly magnetized non-contact torque sensor and method for measuring torque using same. U.S. Pat. No. 5,351,555. 1994.

Garshelis, Ivan J. Collarless circularly magnetized torque transducer and method for measuring torque using same. U.S. Pat. No. 6,260,423 B1. 2001.

Garshelis, Ivan J. Collarless circularly magnetized torque transducer having two phase shaft and method for measuring torque using same. U.S. Pat. No. 5,520,059. 2000.

Garshelis, Ivan J. Collarless circularly magnetized torque transducer having two phase shaft and method for measuring torque using same. U.S. Pat. No. 6,047,605. 2000.

Garshelis, Ivan J., and James M. Cuseo. ""Negative" Hysteresis in Magnetoelastic Torque Transducers." *IEEE*, 2009.

Garshelis, Ivan J. and S. P. L. Tollens. A magnetoelastic force transducer based on bending a circumferentially magnetized tube, J. Appl. Phys 107 09E719. 2010. J. M. Gere, and S. P. Timoshenko. *Mechanics of Materials*. Boston: PWS Publishing Company, 1997.

Ikhouane, F., and J. Rodellar. *Systems with Hysteresis*. Chichester: John Wiley & Sons, Ltd., 2007.

Jiles, D. C., and D. L. Atherton. "Theory of ferromagnetic hysteresis."*Journal on Magnetism and Magnetic Materials* 61, no. 1-2 (September 1986): 48-60.

Jones, Christopher A. Circularly magnetized disk-shaped torque transducer and method for measuring torque using same. U.S. Pat. No. 6,513,395. 2003.

Fraden, Jacob. Handbook of Modern Sensors: Physics, Designs, and Applications. Springer, 2010.

Kari, Ryan J, Tej Patel, Benjamin Canilang, Americo Bomafede, Sami Bitar, and Ivan J. Garshelis. "Magnetoelastic Torquemeter System for LCAC Hovercraft Turboshaft Engine Monitoring and Control." ASME Turbo Expo, no. GT2012-69126 (2012).

Kilmartin, B. "Magnetoelastic Torque Sensor Utilizing a Thermal Sprayed Sense-Element for Automotive Transmission Applications." *SAE* 2003-01-0711 (2003).

Preisach, F. "Über die magnetische nachwirkung." *Zeitschrift für* 94 (1935): 277-302.

Visintin, Augusto. *Differential Models of Hysteresis*. Berlin: Springer-Verlag, 1994.

Wakiwaka, H., and M. Mitamura. "New magnetostrictive type torque sensor for steering shaft." *Sensors and Actuators A-Physical*, 2001: 103-106.

Wun-Fogle, Marilyn, James Restorff, James Cuseo, Ivan Garshelis, and Sami Bitar. "Magnetostriction and Magnetization of Common High Strength Steels." IEEE Trans. on Magnetics, 2009: 4112-4115.

I claim:

1. A computerized method of increasing real-time accuracy of a torque measurement system, the method comprising:
providing, by a power supply, electrical energy for the torque measurement system;
sensing, by a sense element, a change in one or more torque parameters when a torque or time-varying torque is applied to a torque-transmitting member, wherein the sense element or elements are positioned proximate to or on the torque-transmitting member, and wherein at least one temperature sensing element is positioned proximate to the torque-transmitting member to determine temperature of the torque-transmitting member;
outputting, by the sense element, one or more signals indicative of the one or more sensed torque parameters when a torque or time-varying torque is applied to the torque-transmitting member and by the temperature sensing element, a signal indicative of the temperature of the torque-transmitting member;
digitizing, with an analog to digital converter, the one or more output signals indicative of the one or more sensed torque parameters and the temperature of the torque-transmitting member;
receiving, by a processor, in real-time the one or more digitized output signals indicative of the one or more sensed torque parameters and the temperature of the torque-transmitting member to process;
determining, by the processor, hysteresis-dependent errors and temperature-dependent errors in the one or more digitized output signals indicative of the one or more sensed torque parameters;
compensating for, by the processor, the hysteresis-dependent errors and the temperature-dependent errors in the one or more digitized output signals indicative of the one or more sensed torque parameters and the temperature of the torque-transmitting member; and
storing, by the processor, data in a memory, the data representing a torque history experienced by the torque-transmitting member or a degree of prior correction for the hysteresis-dependent errors and the temperature-dependent errors in the one or more signals output by the sense element, wherein the stored data is able to be restored upon power-cycling for further processing.

2. The method according to claim 1, wherein the one or more sensed torque parameters are torque or rate of change of torque applied to the torque-transmitting member.

3. The method according to claim 1, wherein the torque-transmitting member is a torque-transmitting shaft.

4. The method according to claim 1, wherein the torque-transmitting member is a torque-transmitting disk, a torque-transmitting sector of a disk, or a torque-transmitting arm or lever.

5. The method according to claim 1, wherein the sense element is positioned proximate to the torque-transmitting member, and wherein optionally the output signal sensed by the sense element is indicative of the torque or time-varying torque transmitted between radially separated locations.

6. The method according to claim 1, wherein the one or more output signals indicative of the sensed torque parameters exhibit a hysteresis error in a range of 0.01% to 20% for a loading cycle.

7. The method according to claim 1, wherein the at least one temperature sensing element is a resistive temperature device conditioned to measure temperature or a thermocouple conditioned to measure temperature.

8. The method according to claim 1, wherein the processor is configured to correct the temperature-dependent errors, the hysteresis-dependent errors, and a temperature-dependent variation in hysteresis.

9. An automated torque measurement system for increasing real-time accuracy, comprising:
a power supply is configured to provide electrical energy for the torque measurement system;
a sense element is configured to:
sense a change in one or more torque parameters when a torque or time-varying torque is applied to a torque-transmitting member, wherein the sense element or elements are positioned proximate to or on the torque-transmitting member, and wherein at least one temperature sensing element is positioned to determine the temperature of the torque-transmitting member; and
output one or more signals indicative of the one or more sensed torque parameters and by the temperature sensing element a signal indicative of the temperature of the torque-transmitting member;
an analog to digital converter, configured to digitize the one or more output signals indicative of the one or more sensed torque parameters and signals indicative of the temperature of the torque-transmitting member; and
a computer comprising a processor and a memory, the processor configured to:
receive in real-time the one or more digitized output signals of the one or more sensed torque parameters and the temperature of the torque-transmitting member to process;
determine hysteresis-dependent errors and temperature dependent errors in the one or more digitized output signals indicative of the one or more sensed torque parameters;
compensate the hysteresis-dependent errors and the temperature dependent errors in the one or more digitized output signals indicative of the one or more sensed torque parameters and the temperature of the torque-transmitting member; and
store data in a memory, the data representing a torque history experienced by the torque-transmitting member or a degree of prior correction for the hysteresis-dependent errors and the temperature-dependent errors in the one or more signals output by the sense element, wherein the stored data is able to be restored upon power-cycling for further process.

10. The system according to claim 9, wherein the one or more sensed torque parameters are torque or rate of change of torque applied to the torque-transmitting member.

11. The system according to claim 9, wherein the one or more output signals indicative of the sensed torque parameters exhibit a hysteresis error in a range of 0.01% to 20% for a loading cycle.

12. The system according to claim 9, wherein the torque-transmitting member is a torque-transmitting shaft.

13. The system according to claim 9, wherein the torque-transmitting member is a torque-transmitting disk, a torque-transmitting sector of a disk, or a torque-transmitting arm or lever.

14. The system according to claim 9, wherein the sense element is positioned proximate to the torque-transmitting member, or on the torque-transmitting member, and wherein optionally the output signal sensed by the sense element is indicative of the torque or time-varying torque transmitted between radially separated locations.

15. The system according to claim 9, wherein the at least one temperature sensing element is a resistive temperature device conditioned to measure temperature or a thermocouple conditioned to measure temperature.

* * * * *